United States Patent [19]
Miwa et al.

[11] Patent Number: 6,038,165
[45] Date of Patent: Mar. 14, 2000

[54] NONVOLATILE MEMORY DEVICE AND REFRESHING METHOD

[75] Inventors: Hitoshi Miwa; Hiroaki Kotani, both of Ome, Japan

[73] Assignee: Hitachi, Ltd., Tokyo, Japan

[21] Appl. No.: 09/053,494

[22] Filed: Apr. 2, 1998

Related U.S. Application Data

[63] Continuation of application No. 08/860,793, Jul. 9, 1997, Pat. No. 5,889,698.

[30] Foreign Application Priority Data

Jan. 31, 1995 [JP] Japan ..................................... 7-14031

[51] Int. Cl.⁷ .................................................. G11C 11/34
[52] U.S. Cl. ................................ 365/185.03; 365/185.22
[58] Field of Search .......................... 365/185.03, 185.22

[56] References Cited

U.S. PATENT DOCUMENTS

| | | | |
|---|---|---|---|
| 4,435,786 | 3/1984 | Ticlek | 365/185 |
| 4,860,258 | 8/1989 | Fruhauf et al. | 365/194 |
| 4,964,079 | 10/1990 | Devin | 365/168 |

(List continued on next page.)

FOREIGN PATENT DOCUMENTS

| | | |
|---|---|---|
| 59-121696 | 7/1984 | Japan . |
| 62-34398 | 2/1987 | Japan . |
| 62-6493 | 2/1987 | Japan . |
| 62-257699 | 11/1987 | Japan . |
| 62-298999 | 12/1987 | Japan . |
| 63-276791 | 11/1988 | Japan . |
| 1134793 | 5/1989 | Japan . |
| 0215497 | 2/1990 | Japan . |
| 240198 | 2/1990 | Japan . |
| 2260298 | 10/1990 | Japan . |
| 359886 | 3/1991 | Japan . |
| 3237692 | 10/1991 | Japan . |
| 457294 | 2/1992 | Japan . |
| 4184794 | 7/1992 | Japan . |
| 4238196 | 8/1992 | Japan . |
| 5210991 | 8/1993 | Japan . |
| 06076586 | 3/1994 | Japan . |
| 06131881 | 5/1994 | Japan . |

(List continued on next page.)

OTHER PUBLICATIONS

Digest of Technical Papers, TP 2.1: A 3.3V 128Mb Multi–level NAND Flash Memory for Mass Storage Applications, T. Jung, et al., ISSCC96/Session 2/Flash Memory/Paper TP 2.1, 1996 EEE International Solid State Circuits Conf.

1994 Symposium on VLSI Circuits Digest of Technical Papers, High Speed Programming and Program–Verity Methods Suitable for Low–Voltage Flash Memories, T. Tanaka, et al., pp. 61–62.

IEEE Journal of Solid–State Circuits, vol. 31, no. 11, "A 117–mm2 3.3–v only 128–Mb Multilevel NAND Flash Memory for Mass Storage Applications", T. Jung, et al., Nov. 1996, pp. 1575–1583.

*Primary Examiner*—David Nelms
*Assistant Examiner*—M. Tran
*Attorney, Agent, or Firm*—Antonelli, Terry, Stout & Kraus, LLP

[57] ABSTRACT

At the data programming time, data of a plurality of bits are transformed by a data transforming logic circuit into data (multi-value data) according to the combination of the bits, and the transformed data are sequentially transferred to a latch circuit connected to the bit lines of a memory array. A program pulse is generated according to the data latched in the latch circuit and is applied to a memory element of a selected state corresponding to the multi-value data. At the data reading operation, the states of the memory elements are read out by changing the read voltage to intermediate values of the individual threshold values and are transferred to and latched in a register for storing the multi-value data, so that the original data may be restored by a data inverse transforming logic circuit on the basis of the multi-value data stored in the register. As a result, the peripheral circuit scale of the memory array can be suppressed to a relatively small size, and a programming operation performed in a short time can be realized.

84 Claims, 20 Drawing Sheets

U.S. PATENT DOCUMENTS

| | | | |
|---|---|---|---|
| 5,059,554 | 10/1991 | Spinner et al. | 437/193 |
| 5,084,417 | 1/1992 | Joshi et al. | 437/192 |
| 5,151,387 | 9/1992 | Brady et al. | 437/191 |
| 5,163,021 | 11/1992 | Mehrotra et al. | 365/185 |
| 5,172,338 | 12/1992 | Mehrotra et al. | 365/185 |
| 5,200,920 | 4/1993 | Norman et al. | 365/185 |
| 5,365,486 | 11/1994 | Schreck | 365/222 |
| 5,412,601 | 5/1995 | Sawada et al. | 365/185.03 |
| 5,440,505 | 8/1995 | Fazio et al. | 365/45 |
| 5,450,363 | 9/1995 | Christopherson | 365/205 |
| 5,487,036 | 1/1996 | Akaogi et al. | 365/185.23 |
| 5,539,688 | 7/1996 | Yiu et al. | 365/185.14 |
| 5,544,099 | 8/1996 | Hara | 365/185.19 |
| 5,555,204 | 9/1996 | Endoh et al. | 365/189.01 |
| 5,566,125 | 10/1996 | Fazio | 365/45 |
| 5,570,315 | 10/1996 | Tanaka et al. | 365/185.22 |
| 5,602,789 | 2/1997 | Endoh et al. | 365/201 |
| 5,615,153 | 3/1997 | Yiu et al. | 365/185.19 |
| 5,621,682 | 4/1997 | Tanzawa et al. | 365/185.03 |
| 5,675,537 | 10/1997 | Bill et al. | 365/185.22 |
| 5,677,868 | 10/1997 | Takahashi et al. | 365/185 |
| 5,677,869 | 10/1997 | Fazio et al. | 365/185.03 |
| 5,687,114 | 11/1997 | Khan | 365/185.03 |
| 5,694,357 | 12/1997 | Mori | 365/185.03 |
| 5,745,409 | 4/1998 | Wong et al. | 365/185.03 |
| 5,748,533 | 5/1998 | Dunlap et al. | 365/185.19 |
| 5,754,469 | 5/1998 | Hung et al. | 365/186.03 |
| 5,754,476 | 5/1998 | Bill et al. | 365/185.25 |
| 5,757,699 | 5/1998 | Takeshima et al. | 365/185.24 |
| 5,768,188 | 6/1998 | Park et al. | 365/185.03 |
| 5,768,191 | 6/1998 | Choi et al. | 365/185.22 |
| 5,768,193 | 6/1998 | Lee et al. | 365/185.25 |
| 5,796,652 | 8/1998 | Takeshima et al. | 365/185.03 |
| 5,831,900 | 11/1998 | Miyamoto | 365/185.03 |

FOREIGN PATENT DOCUMENTS

| | | |
|---|---|---|
| 06195987 | 7/1994 | Japan . |
| 06267285 | 9/1994 | Japan . |
| 06282992 | 10/1994 | Japan . |
| 06309890 | 11/1994 | Japan . |
| 07057484 | 3/1995 | Japan . |
| 07093979 | 4/1995 | Japan . |
| 07161852 | 6/1995 | Japan . |

FIG. 1

| | | | | | |
|---|---|---|---|---|---|
| (1) | 1ST DATA a | 0 | 1 | 0 | 1 |
| | 1ST DATA b | 0 | 0 | 1 | 1 |
| | 2-BIT DATA | '00' | '01' | '10' | '11' |
| (2) | 1ST OPERATION (a NAND b) | 1 | 1 | 1 | 0 |
| | 2ND OPERATION (NOT b) | 1 | 1 | 0 | 0 |
| | 3RD OPERATION (a NOR b) | 1 | 0 | 0 | 0 |
| | NO. OF 1 | 3 | 2 | 1 | 0 |

(3)

| DATA | THRESHOLD VALUE |
|---|---|
| '00' | $V0 - 3Va$ |
| '01' | $V0 - 2Va$ |
| '10' | $V0 - Va$ |
| '11' | $V0$ (=ERASE LEVEL) |

FIG. 2

| | | | | | | |
|---|---|---|---|---|---|---|
| c | 0 | 0 | 0 | 1 | (READ LEVEL: HIGHT) | |
| d | 0 | 0 | 1 | 1 | (READ LEVEL: MEDIUM) | |
| f | 0 | 1 | 1 | 1 | (READ LEVEL: LOW) | |
| $\overline{d}$ NAND f | 1 | 0 | 1 | 1 | | |
| ($\overline{d}$ NAND f) NAND $\overline{c}$ | 0 | 1 | 0 | 1 | = a | |
| d | 0 | 0 | 1 | 1 | = b | |

(1)

(2)

(3)

(4)

(A)

ERASE
"00","01","10","11"

"10" PROGRAM
"00","01","11"
"10"

"01" PROGRAM
"01","10","00","11"

"00" PROGRAM
"00","01","10","11"

2. EACH UNIT LEVEL (B)

ERASE
"00","01","10","11"

"00","01","10" PROGRAM
"00","01","10"
"11"

"00","01" PROGRAM
"00","01"
"10"
"11"

"00" PROGRAM
"00"
"01"
"10"
"11"

1. BATCH OF PLURAL LEVELS

EXAMPLE OF APPLIED VOLTAGES AT PROGRAMMING TIME

EXAMPLE OF APPLIED VOLTAGES AT ERASING TIME

EXAMPLE OF APPLIED VOLTAGES AT READING TIME

NONVOLATILE MEMORY DEVICE AND REFRESHING METHOD

This is a continuation of application Ser. No. 08/860,793, filed Jul. 9, 1997 now U.S. Pat. No. 5,889,698.

TECHNICAL FIELD

The present invention relates to a technique which is especially effective when applied to a multi-value data storing system in a semiconductor memory device and a nonvolatile semiconductor memory device, for example, to a technique which is effective when applied to a nonvolatile memory device (hereinafter referred to as the "flash memory") for batch-erasing a plurality of memory data electrically.

BACKGROUND ART

A flash memory uses nonvolatile memory elements each having a control gate and a floating gate similar to FAMOSS, as its memory cells, and each memory cell can be constructed of one transistor. In such a flash memory, for a programming operation, the drain voltage of the nonvolatile memory element is set to about 5 V, as shown in FIG. 12, and the word line connected to the control gate is set to about −10 V, so that the charge on the floating gate is drawn therefrom by tunnel current to set the threshold voltage to a low value (logic "0").

For the erasing operation, as shown in FIG. 13, the P-type semiconductor region pwell is set to about −5 V, and the word line is set to about 10 V, so that tunnel current is caused to flow to inject negative charges into the floating gate, thereby to set the threshold value to a high state (logic "1"). Thus, one memory cell is able to store the data of one bit.

Incidentally, there has been the concept of a so-called "multi-value" has been proposed in which data of two or more bits are stored in one memory cell so as to increase the storage capacity. An invention relating to such a multi-value memory is disclosed in Japanese Patent Laid-Open No. 121696/1984.

In a flash memory of the prior art, it is known that the variation of the threshold value is increased due to both a weak program (the disturb) or the like caused by the programming reading and erasing operations of an adjacent bit and natural leakage (the retention), and consequently, the half-value width (the width of the peak of the bell-shaped variation distribution at the position of a half peak value, as shown in FIG. 3) of the variation distribution of the threshold value corresponding to logic "0" and increases with the lapse of time. The inventors have found that, with the lower level of the power supply voltage of future LSIS, the threshold voltage of the memory cells may exceed the marginal range for the read voltage by the broadening of the variation distribution with time, thereby to cause a malfunction.

This problem is especially serious in a multi-value memory for storing one memory element with data of a plurality of bits by the difference between the threshold values, because this difference is small for the individual data. In a flash memory, moreover, there is a technical problem for minimizing the processing time and the circuit scale intrinsic to the multi-value memory, because of the erasing and program verifying operations intrinsic to the nonvolatile memory device.

SUMMARY OF THE INVENTION

An object of the present invention is to provide a multi-value type nonvolatile memory device which can realize programming, reading and erasing operations of high accuracy performed in a short time while minimizing the increase in the circuit scale.

Another object of the present invention is to provide a method of sharpening the shape of the variation distribution of the threshold values, and accordingly, to a nonvolatile memory device capable of stably operating at a low voltage.

Representatives features of the invention to be disclosed herein will be briefly summarized in the following.

(1) At the data programming time, data of a plurality of bits are transformed by a data transforming logic circuit into data (multi-value data) according to the combination of the bits, and the transformed data are sequentially transferred to a latch circuit connected to the bit lines of a memory array. A program pulse is generated according to the data latched in the latch circuit and is applied to a memory element in a selected state, so that it is brought into a state in which it has a threshold value corresponding to the multi-value data. In the data reading operation, the states of the memory elements are read out by changing the read voltage to intermediate values of the individual threshold values and are transferred to and latched in a register for storing the multi-value data, so that the original data may be restored by an inverse data transforming logic circuit on the basis of the multi-value data stored in the register.

(2) After a weak erasing operation of the memory elements in the memory array has been executed, the memory element, which has a threshold value lower than the read level of the word line and higher than the verify level, is detected, and the program is executed such that the threshold value of the memory element may be lower than the verify voltage thereby to narrow the width of the variation distribution shape of the threshold voltage of the memory element which is programmed correspondingly to the individual input data.

According to the aforementioned feature (1), the peripheral circuit scale of the memory array can be suppressed to a relatively small size. In the programming operation, the verify voltage value of the word line is sequentially changed (as will be seen in (1) to (4) of FIG. 3) by a predetermined value in a direction away from the near side of the erasing word line voltage, so that the total number of the program pulses, i.e., the program time, can be made shorter than that of the multi-value flash memory system, in which the verify voltage is set at random, thereby to realize a programming operation performed in a short time.

According to the aforementioned feature (2), on the other hand, the shape of the variation distribution of the threshold voltage of the memory elements, which has been widened due to disturb or retention influences, can be returned to a steep shape substantially identical to that just after the end of the programming operation.

BRIEF DESCRIPTION OF DRAWINGS

FIG. 1 is an explanatory diagram showing one example of the operation of transforming two-bits of data to be programmed in one memory cell and read therefrom into quaternary data of the level to be physically programmed in each memory cell and read therefrom in accordance with the present invention.

FIG. 2 is an explanatory diagram showing one example of the operation of inversely transforming quaternary data transformed by a data transforming logic circuit into the original two-bits of data.

FIG. 15 is a block diagram showing an internal power source generator and a switching circuit for selecting and feeding the generated voltage to a word driver or the like.

DETAILED DESCRIPTION OF THE INVENTION

With reference to an accompanying drawings, the embodiment of the invention as applied to a flash memory will be described.

FIG. 1 shows a method of transforming data to be inputted from the outside and stored, and multi-value data to be stored in memory cells, and FIG. 2 shows an inverse transforming method for restoring the original data from the multi-value data.

FIG. 1 shows an example of the transformation method in which any of two bits, i.e., "00", "1" "10" and "11" is to be stored in one memory cell, although the invention is not especially limited thereto. There are four kinds of combinations of the first binary data "a" and the second binary data "b" in FIG. 1(1), and these individual combinations are transformed into four kinds of quaternary data having 0, 1, 2 and three "1" in the four bits, by executing three kinds of logic operations (aNANDb), (NOTB) and (aNORb), as shown in FIG. 1(2).

Figure 3:
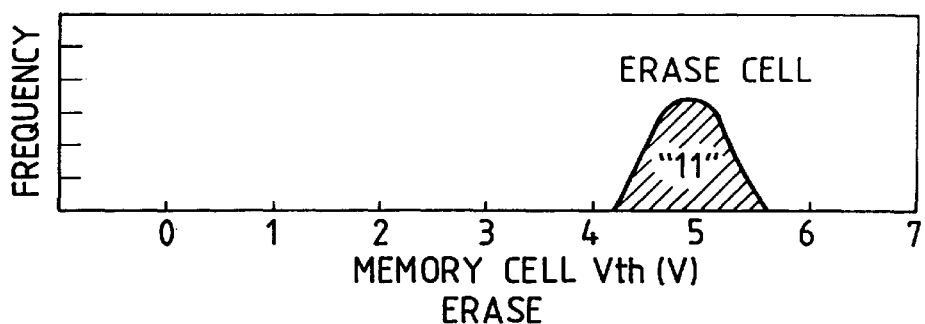
FIG. 3 is an explanatory diagram showing the relations between the quaternary data and the threshold values of the memory cells.
Figure 3:
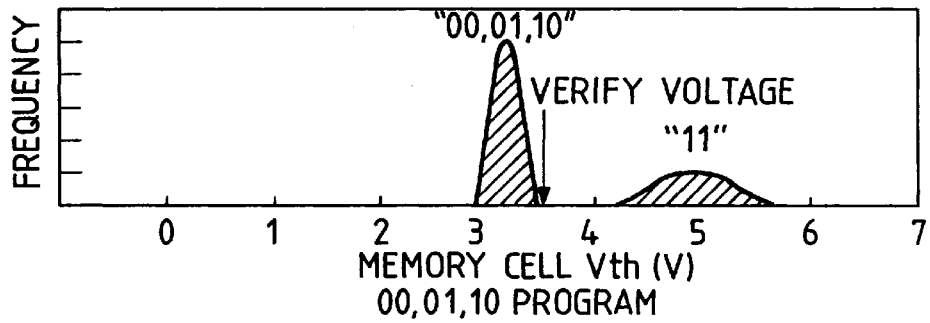
Figure 3:
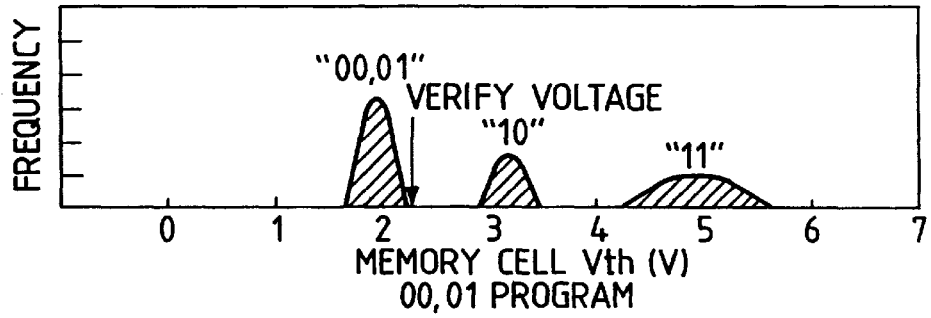
Figure 3:
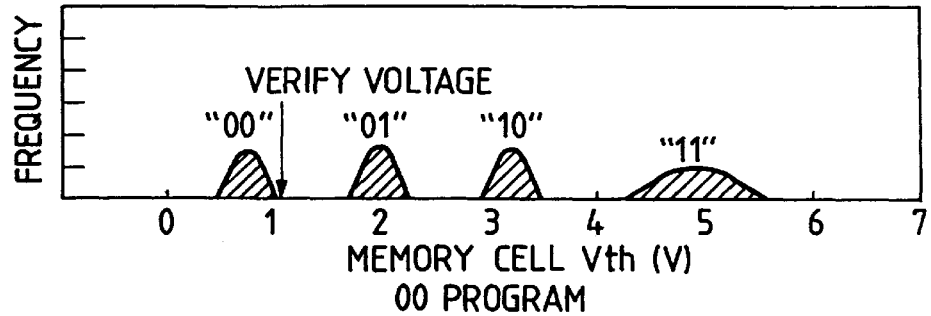

Here, if the memory elements whose number is equal to a that of the number of "1s" as a result of the aforementioned operation are subjected to programming operation, i.e., the application of program pulses, they will have four types of threshold values, as shown in FIG. 1(3), according to the number of programming operations, so that two-bits of data can be programmed in one memory cell. The states of the changes in the threshold value distributions of the individual memory elements are shown in FIG. 3 when the data "00", "01", "01" and "11" are to be stored in the same number in a plurality of memory elements in the memory array.

FIG. 2 shows the data reading principle. By changing the read voltages of word lines at three stages (intermediate values of the individual threshold value distributions of FIG. 3), three kinds of data "c", "d" and "f", can be sequentially read out from one memory cell. Then, one (a) of the programmed two-bits data can be restored by executing a logic operation (D*NAND F)NAND c* on the read-out data. Of the read-out data, moreover, the data d are identical, as they are, to the program data b. Incidentally, symbols d* and c* designate the inverted signals of the data d and c.

Figure 4:
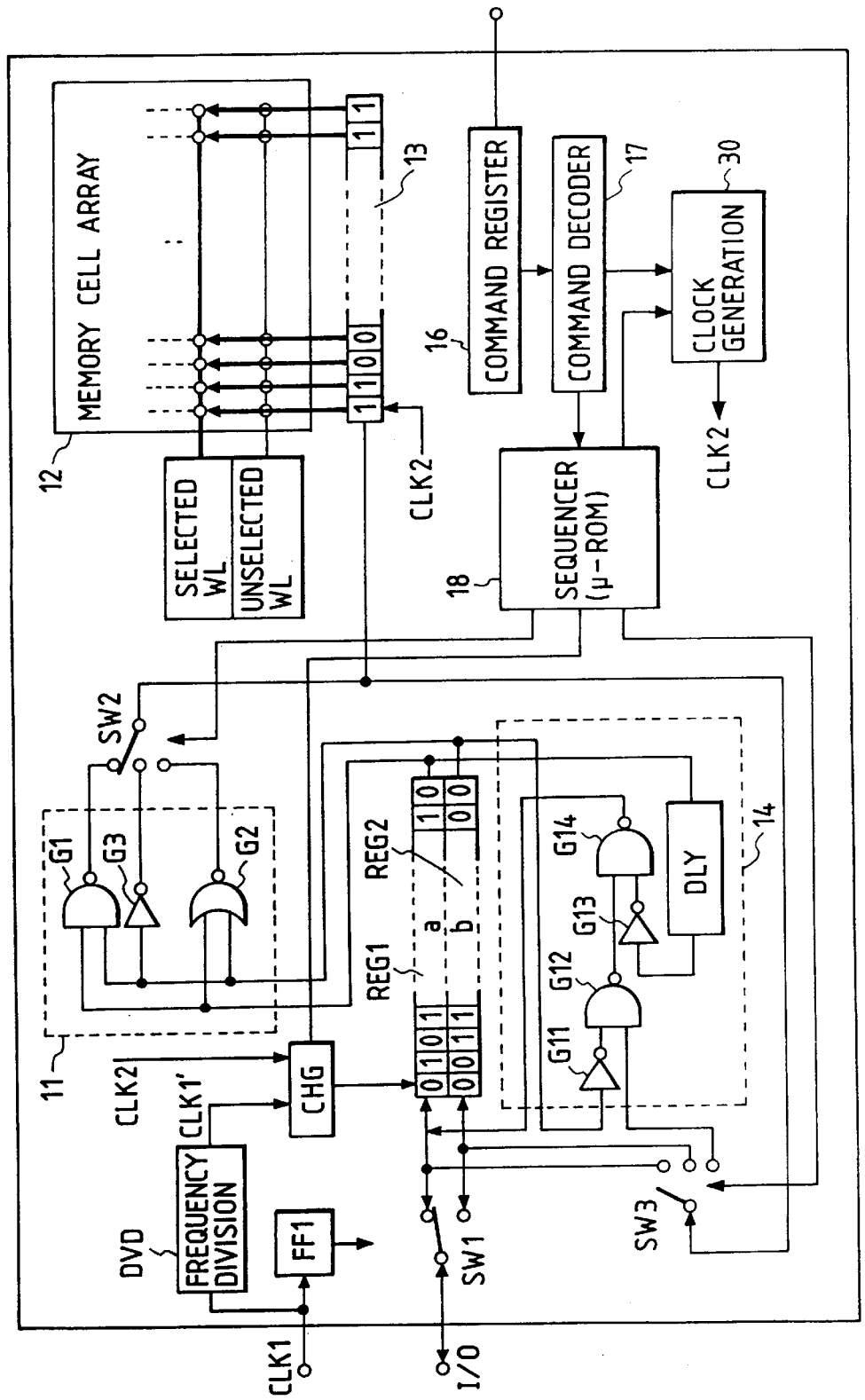
FIG. 4 is a circuit diagram schematically showing one embodiment of a multi-value flash memory according to the present invention.

FIG. 4 shows one specific example of the circuit construction for the transformation of multi-value data and the inverse transformation, as shown in FIGS. 1 and 2.

At the data programming time, the data of 2n-bits bit length, fed from the outside to the multi-value flash memory, are serially stored through a switch Sw1 in two binary data registers REG1 and REG2 having a data width of n-bits. At this time, the switch SW1 is changed by the output of a flip-flop FF1 driven by a clock signal CLK1 fed from the outside, although the invention is not especially limited thereto, and a clock signal CLK1', produced in a frequency divider DVD by dividing the clock signal CLK1 and having a frequency twice as large as the clock signal CLK1, is fed through a change-over circuit CHG. In synchronism with this clock signal CLK1', the binary registers REG1 and REG2 are shifted, so that the input data are alternately latched bit by bit in the data registers REG1 and RED2.

The data "a", latched in the first binary register REG1, and the data "b", latched in the second binary register REG2, are shifted in synchronism with the clock signal CLK2 which is fed from an internal clock generator 30 through the change-over circuit CHG, fed bit by bit to a data transforming logic ctrcuit 11 for the operations of FIG. 1(2), and then sequentially transferred after a predetermined logic operation through a switch SW2 to a sense latch circuit 13 having an n-bits length and disposed on one side of a memory array 12, so that they are programmed in the memory cells of the memory array 12. These programming operations will be described later in more detail.

The aforementioned change-over circuit CHG is switched, by a control signal coming from a sequencer 18 for controlling the memory inside, to feed the clock signal CLK1' to the binary registers REG1 and REG2 at 2Cj the data input time and the clock signal CLK2 from the clock generator 30 to the binary registers REG1 and REG2 at the time of data transfer with the sense latch 13.

The aforementioned data transforming logic circuit (the data programming operation circuit) 11 is constructed to include: a NAND gate G1 which is allowed to receive at the individual input terminal the data a and b in the binary data registers REG1 and REG2 and to perform the operation (aNANDb) and a NOR gate which is also allowed to receive at the input terminal the data a, b and to perform the operation (aNORb); and an inverter G3 which is allowed to receive at its input terminal the data b of the binary data register REG2 and to perform the operation (NOTb). The switch SW2 selects and feeds any of the output signals of those logic gates G1, G2 and G3 to the sense latch circuit 13.

At the data reading time, on the other hand, the read data "c", having appeared on a bit line in response to the setting of one word line in the memory array 12 to the read voltage level, are amplified and latched by the sense latch circuit 13 and are serially transferred through a switch SW3 to the binary data register REG1 in synchronism with the internal clock signal CLK2.

Next, the data "d", read out to the sense latch circuit 13 by changing the read voltage level, are serially transferred to the binary data register REG2 through the switch SW3. Moreover, the data "f", read out to the sense latch circuit 13 by changing the read voltage level, are serially transferred to an inverse transforming logic circuit 14 through the switch SW3. At this time, the binary registers REG1 and REG2 are shifted in synchronism with the clock signal CLK2.

Here, the period of the clock signal CLK2 at the data reading time may be shorter than that of the clock signal CLK2 at the data programming time. The clock CLK2 can be generated which has a period determined by the clock generator 30 in accordance with the control signal from the sequencer 18. The change in the word line reading level is also changed according to the control signal from the sequencer 18.

The inverse transforming logic circuit (the data reading operation circuit) 14 is constructed to include: an inverter G11 for receiving the data outputted from the binary data register REG2; a NAND gate G12 for directly receiving at its input terminals both the output of the inverter G11 and the data transferred from the sense latch circuit 13; a delay circuit DLY for delaying the data outputted from the binary data register REG1 and transmitting the delayed data at a predetermined timing; an inverter G13 for inverting the signal coming from the delay circuit DLY; and a NAND gate G14 for receiving the output of the inverter G13 and the output of the NAND gate G12. The logic operations (D*NAND F)NAND c*, shown in FIG. 2 are executed for the read-out data c and d, latched in the binary data registers REG1 and REG2, and for the read-out data f, transferred directly from the sense latch circuit 13. These operation results are outputted through the switch SW1 to a data input/output terminal I/O.

At the same time that the one-bit data are thus outputted, the binary data register REG2 is shifted so that one bit of the data "d" (=b) latched are outputted. At this time, the shift operation of the binary registers REG1 and REG2 are synchronized with the clock signal CLK2. Next, the next bits of the data "c" and "d" are read out again from the binary data registers REG1 and REG2, and the logic operations (D*NAND F)NAND c* are executed for the next one bit of the read-out data "f" which are directly transferred from the sense latch circuit 13. By repeating operations similar to the aforementioned ones, the data "a" and "b", having been backward transformed and restored to the original two bits, are outputted to the outside from the data input/output terminal I/O.

Incidentally, the data "a", inversely transformed by the inverse transforming logic circuit 14, do not necessarily need to be instantly outputted to the input/output terminal I/O, as described above. Alternatively, the data "a" inversely transformed may be first latched in the binary data register REG1 and then outputted to the input/output terminal I/O alternately with the data in the binary data register REG2 after all bits have been inversely transformed. In this alternative case, a one-bit latch circuit may desirably be provided in place of the aforementioned delay circuit DLY.

As a result, the data "c" in the binary register REG1 can be read out bit by bit and logically operated with the data "d" and "f", and the results can be simply programmed in the original bit positions in the binary data register REG1. The shift operations of the binary registers REG1 and REG2, when the inversely transformed data are outputted to the outside after they are once latched in the binary registers REG1 and REG2, can be synchronized with the clock signal CLK1 coming from the outside.

The flash memory of this embodiment is equipped, although the invention is not especially so limited, with: a command register 16 for latching the command fed-by an external CPU or the like; a command decoder 17 for decoding the command latched in the command register 16; and a sequencer 18 for sequentially producing and outputting the control signals for the individual circuits, such as the aforementioned switches SW2 and SW3, to execute the processings corresponding to those commands on the basis of the decoded results of the command decoder 17. The flash memory thus constructed decodes the commands, when fed, and executes the corresponding processing automatically. The aforementioned sequencer 18 is constructed to include a ROM (Read Only Memory) latching a series of micro instruction groups necessary for executing the commands (or instructions), like the control unit of a CPU of the micro program type, so that the micro programs are started when the command decoder 17 generates the leading address of the micro instruction groups, which correspond to the commands, and feeds the address to the sequencer 18.

Figure 5:
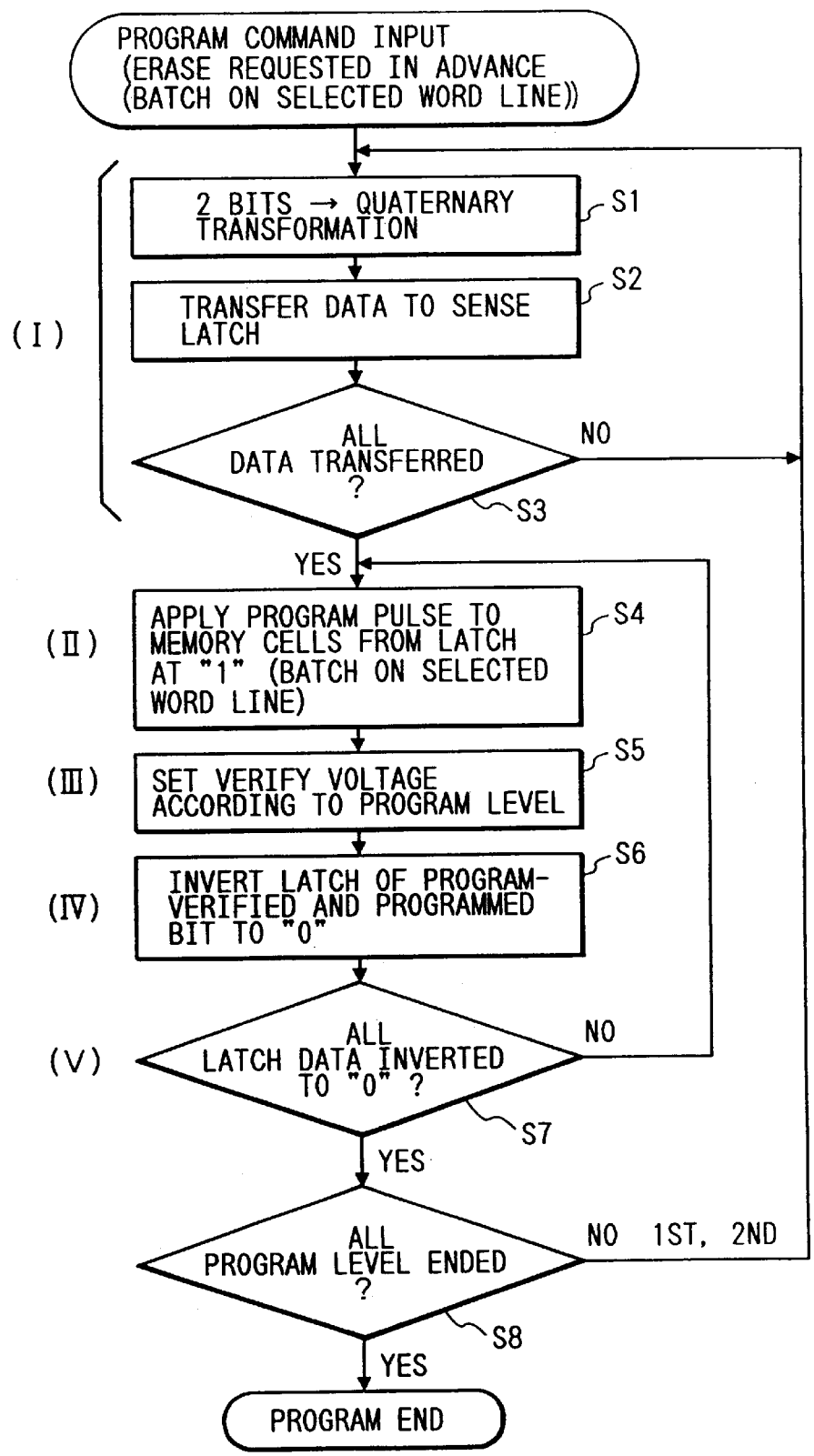
FIG. 5 is a flow diagram showing a programming procedure of the multi-value memory of the embodiment.

The detailed programming procedure will be described in the following in accordance with the programming flow of FIG. 5.

Figure 13:
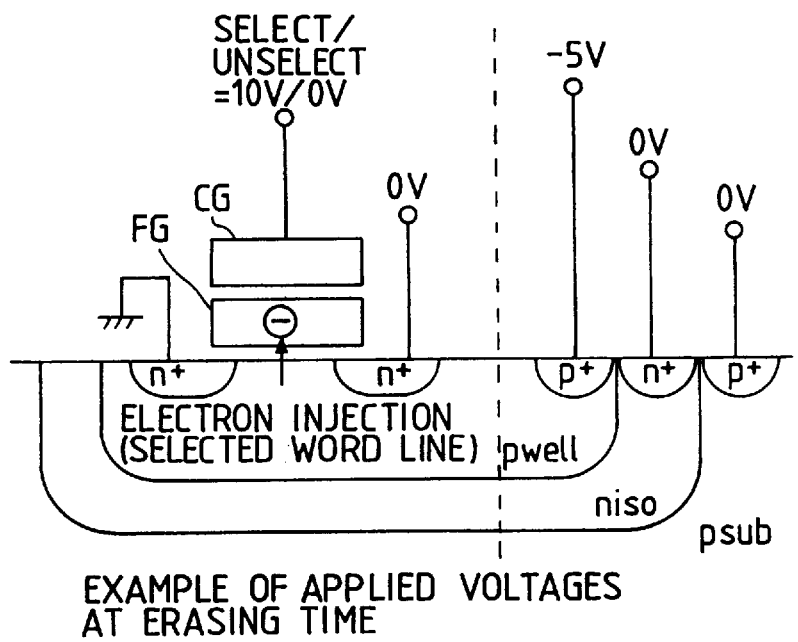
FIG. 13 is a diagram showing the voltage state at the erasing time of the memory cell used in the flash memory of the embodiment.

First of all, prior to the programming, all the memory cells are batch-erased. As a result, all the memory cells are caused to have the highest threshold value (of about 5 V) and to be brought into the state (as shown in FIG. 3(1)) such that they store "11" as the program data. The batch erase operation is carried out, as shown in FIG. 13, by raising the voltage of the word line to apply a voltage of 10 V to the control gate CG of the memory cell, a voltage of 0 V to the drain through the bit line and a voltage of −5 V to the substrate (the semiconductor region p-well) thereby to inject electrons into a floating gate FG. The batch erase process is executed by programming in the command register i6 the erase command coming from the external CPU to instruct the erase operation.

Incidentally, in FIG. 13 (FIG. 12 and FIG. 14): reference symbol psub designates a p-type semiconductor substrate; pwell designates a p-type semiconductor well region for the base of the memory cell; niso designates an n-type semiconductor isolation region for effecting the isolation from the substrate pseb at the data erasing time (at the negative voltage applying time); n+ in the surface of the p-type well region pwell designates the source and drain regions of the memory cell; and p+ in the surface of the p-type well region pwell, n+ in the surface of the isolation region niso, and p+ in the surface of the substrate psub designate the contact regions for reducing the resistances of the contacts with the electrodes for applying the potentials to the individual semiconductor regions. In one p-type well region there is formed memory cells which are connected to word lines, say, one hundred and twenty eight word lines, although the invention is not especially limited thereto, so that all of the memory cells formed over one well can be batch-erased. Moreover, the memory cells can be erased a unit of a word line by rendering the word line potential selected (10 V)/unselected (0 V) for -the memory cells over one p-type well region.

After the end of the batch erase operation, the flash memory is brought into the program mode by programming in the command register 16 of FIG. 4 the program command coming from the external CPU. In this program mode, the program data are inputted at a predetermined timing. Then, the flash memory sends the program data to the binary data registers REG1 and REG2, so that the program data are transferred in units of two bits to the transforming logic circuit 11 and are transformed into quaternary data (at Step 81). The transformations are carried out in the order of aNANDb, NOTB (inversion of b) and aNORb. The transformed data (the first transformation is aNANDb) are transferred to the sense latch circuit 13 (Step S2).

Figure 10:
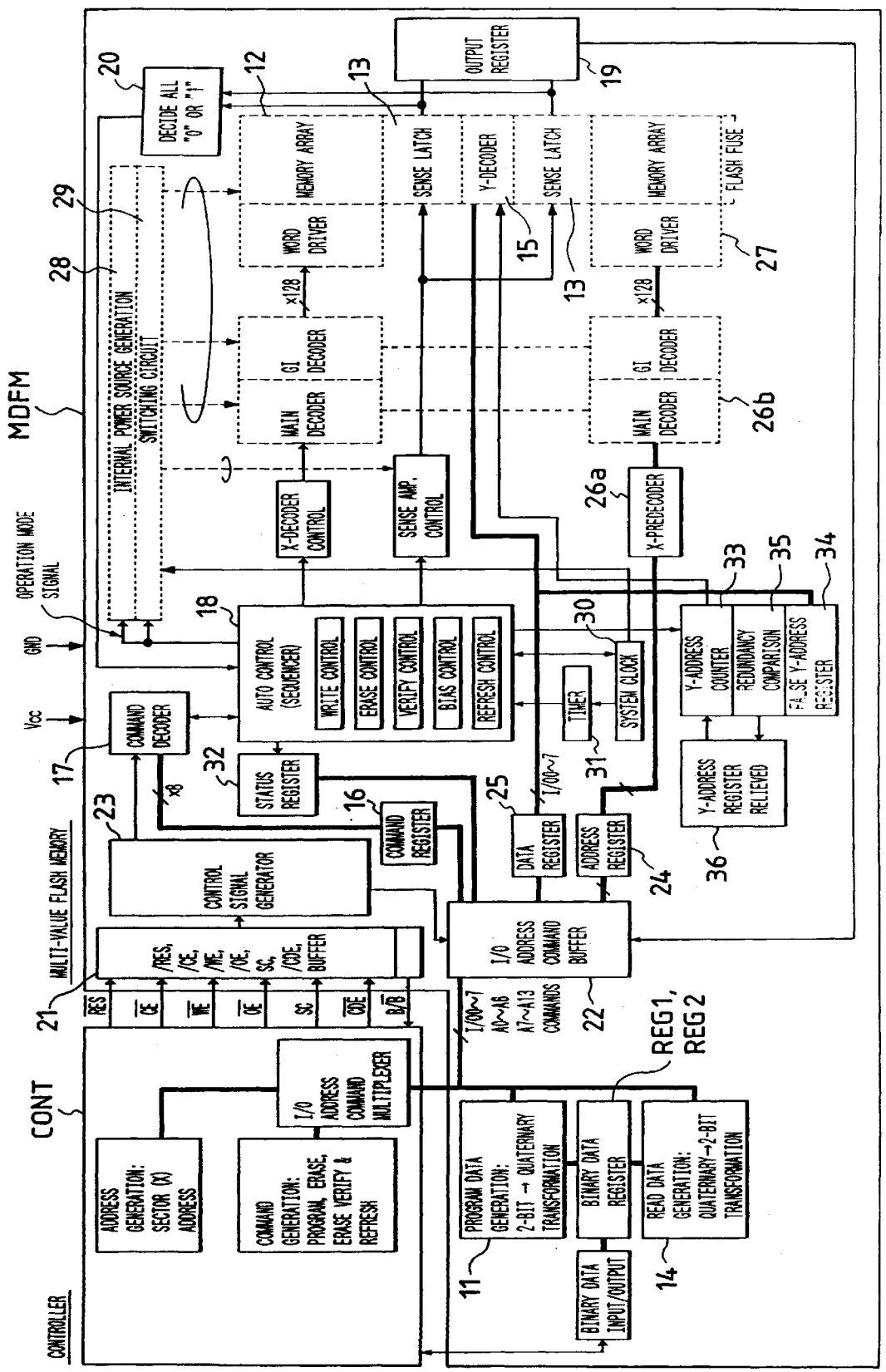
FIG. 10 is block diagram showing an example of the entire structure of the multi-value flash memory of the embodiment.
Figure 12:
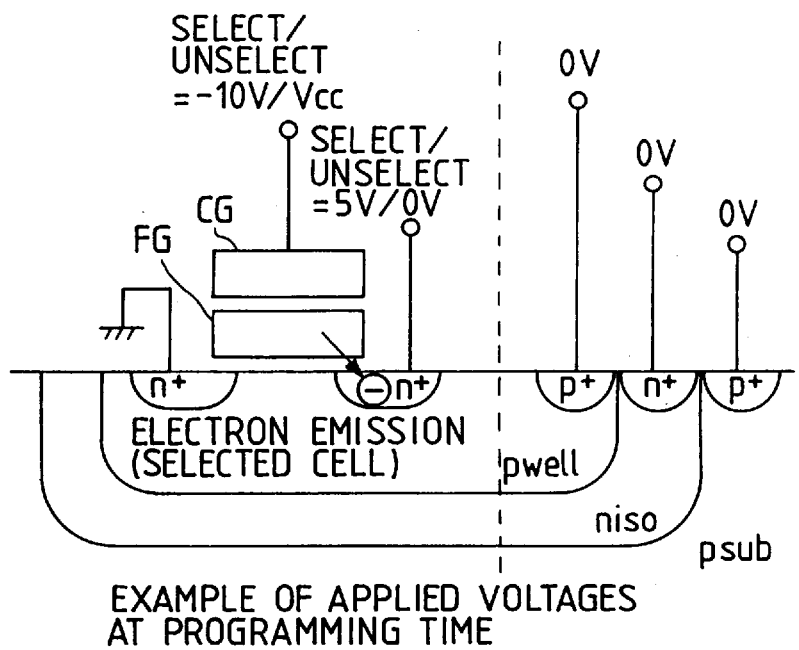
FIG. 12 is a diagram showing the structure of a memory cell used in the flash memory of the embodiment and the voltage state at the programming time.

At the next Step S3, it is judged whether or not all the data in the binary data registers REG1 and REG2 have been transferred. If this judgment is YES, a program pulse having a predetermined pulse width is applied to the memory cell of the bit which corresponds to the value "1" of the X (row) address fed from the external CPU and the Y (column) address outputted from a built-in Y-address counter 33, as shown in FIG. 10, (at Step S4), so that the programming is executed. The programming is carried out, as shown in FIG. 12, by applying a voltage of −10 V to the control gate CG through the word line, a voltage of 5 V from the sense circuit to the drain through the bit line, and a voltage of 0 V to the substrate. Incidentally, at this time, a voltage Vcc (e.g., 3.3 V) is applied to the unselected word line. As a result, fluctuation of the threshold value due to the disturb influence is suppressed.

Next, the verify voltage (about 3'.5 V for the first time) corresponding to the program level is fed to the word line, which is left in the selected state at the programming time, to read out the data in the memory cell to which the program pulse has been applied. The data "0" is read out as read-out data from the memory cell which has been sufficiently programmed, whereas the data "1" is read out from the memory cell which has been insufficiently programmed. It is, therefore, judged according to the programmed data whether the program has been ended or insufficient. Here, the data of the sense latch circuit 13, which have been programmed, are inverted to "0" (Step S6). Moreover, it is judged whether or not all the latch data of the sense latch circuit 13 take the value "0". If all take "0", the programming in this procedure is ended. If there is any insufficiently programmed memory cell having the latch data "1", the routine is returned from Step S7 to Step S4, so that the program pulse is applied again to the memory cell which is insufficiently programmed to have the value "1". By repeating Steps S4, to S7, the program pulse is repeatedly applied so that the threshold values of all the memory cells may become lower than the program verify voltage. As a result, the programmed memory cells have a threshold value of about 3.2 V on an average.

When the programming of the desired data in all the memory cells is ended by the aforementioned program verifying operation, all the data of the sense latch circuit 13 will take the value "0", so that the routine advances to Step S8, at which it is judged whether or not the programming operations for all the program levels have ended, that is, whether or not the data "10", "01" and "00" have been programmed. If the judgment is NO, the routine is returned to Step S1, at which quaternary data based on the next operation result (NOTB) are programmed in the memory cells to change the verify voltage of the word line (2.5 V for the second time). As a result of this verification, the programmed memory cells have a threshold value of about 2.2 V on an average. After this, the programming and verification (at a verify voltage of 1.5 V) of the third operation result are executed, so that the programmed memory cells have a threshold value of about 1.2 V on an average, thus ending the programming.

Figure 6:
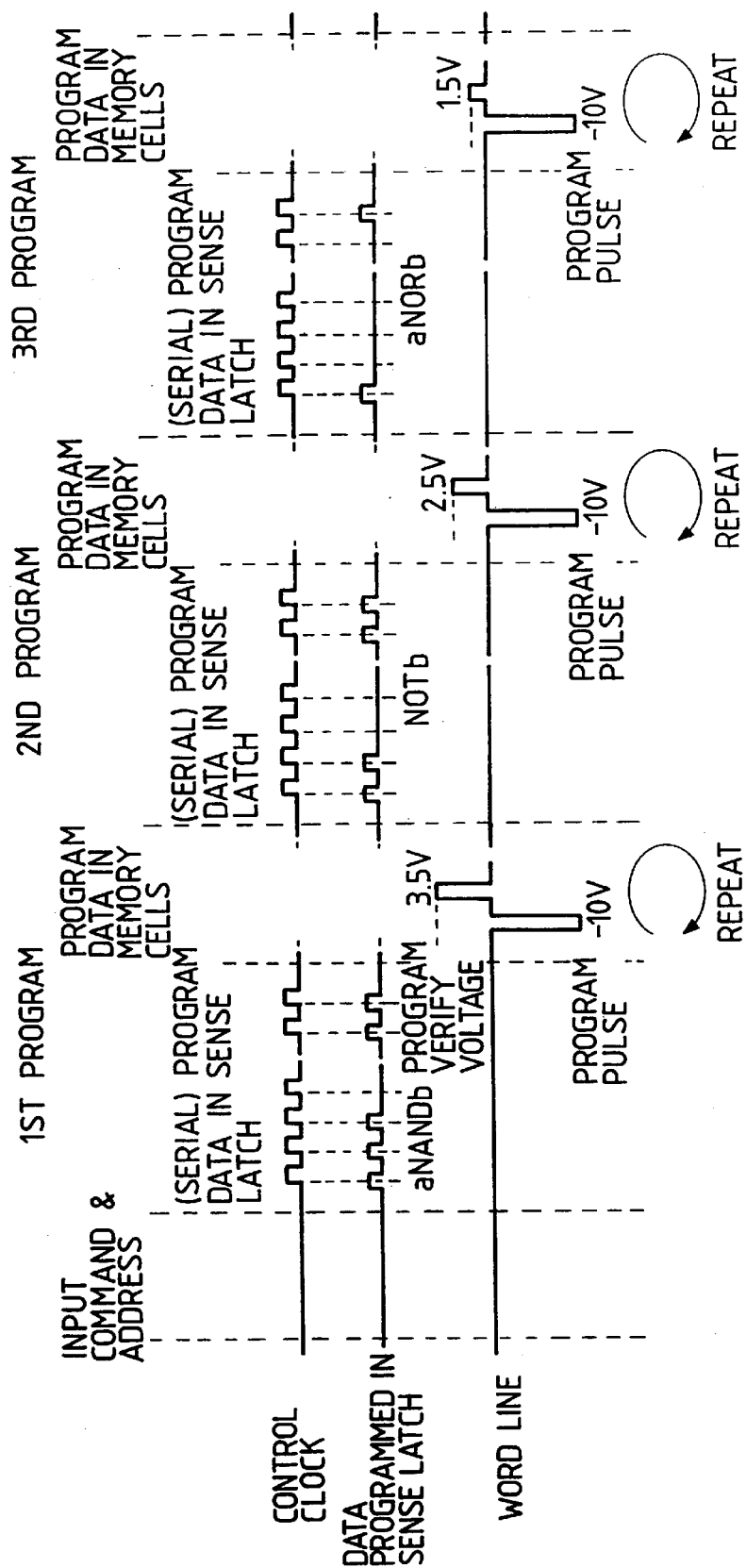
FIG. 6 is a timing chart showing the programming operation waveforms of the multi-value flash memory of the embodiment.

FIG. 6 shows the waveforms of the control clock signal CLK2, the data to be programmed in the sense latch circuit 13, and the potential of the selected word line in the aforementioned programming and program verifying operations. In the first programming, the first operation result (aNANDb) is transferred to the sense latch circuit 13, and the selected memory cell having the latch value "1" is then programmed by the program pulse. Next, a voltage of about 3.5 V, for example, is fed as the program verify voltage to the word line, and it is judged whether or not the programmed data have the value "0". When the threshold value is higher than 3.5 V, the read-out data have the value "1" and are found to have been insufficiently programmed, so that the programming operations are repeated till the read-out data have the value "0". Next, the second operation result (NOTB) is transferred to the sense latch circuit 13, so that the programming operation of the desired memory cell is started by the program pulse. The program verify voltage is set to about 2.5 V, and it is judged whether or not the programming is insufficient. If the judgment is YES, the programming is executed again. Finally, the third program result (aNORb) is transferred to the sense latch circuit 13, and a procedure like the aforementioned one is executed. The program verify voltage in this case is about 1.5 V.

In the foregoing embodiment, as described above, the setting of the word line voltage at the three program verify stages is so controlled that the voltage value is sequentially changed (3.5 V–2.5 V 1.5 V) away from the erase level from the starting point of the level (3.5 V) which has been set at the closest value to the erase level (about 5 V).

Figure 7:
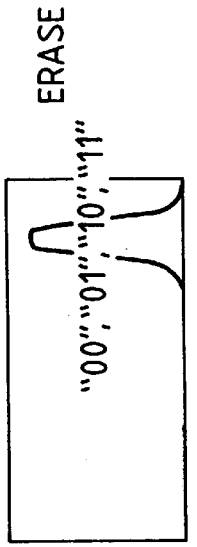
FIG. 7 is an explanatory diagram of the operation waveforms showing the difference between the programming method of the multi-value flash memory of the embodiment and another programming method.
Figure 7:
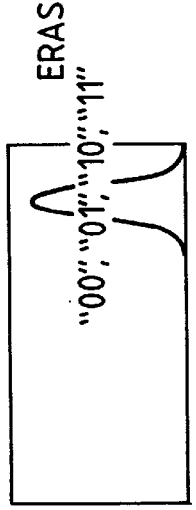
Figure 7:
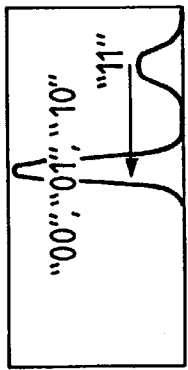
Figure 7:
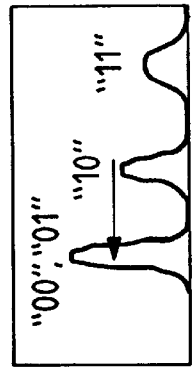
Figure 7:
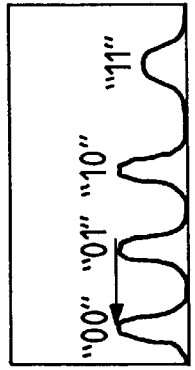

In the foregoing embodiment, moreover, even the memory cell of which the target threshold value is an intermediate or lowest value (2.2 V, 1.2 V) is programmed simultaneously with the programming of the memory cell whose target threshold value is the highest value (3.2 V), as shown in FIG. 7(B). This is one of the features of the present invention. As a result, the increase in the programming time of the multi-value data can be minimized.

Specifically, in addition to the aforementioned method, a conceivable method for setting the programming and program verifying word line voltage is one in which the setting is changed so as to execute the first programming of memory cells, as the programming object, having an intermediate threshold voltage (2.2 V) out of the three kinds of threshold voltage, and the second programming of memory cells, as the programming object, having a voltage (3.2 V) higher than the voltage of the first programming or a voltage 1.2 V) lower than that. As shown in FIG. 7(A), alternatively, there can be conceived a method for batch-programming the memory cells having an identical target threshold value. According to these methods, however, it takes a long time for programming, and the time for the charge/discharge to change the word line voltage is increased, so that the time for the program/verify becomes longer than that of the present embodiment.

Figure 8:
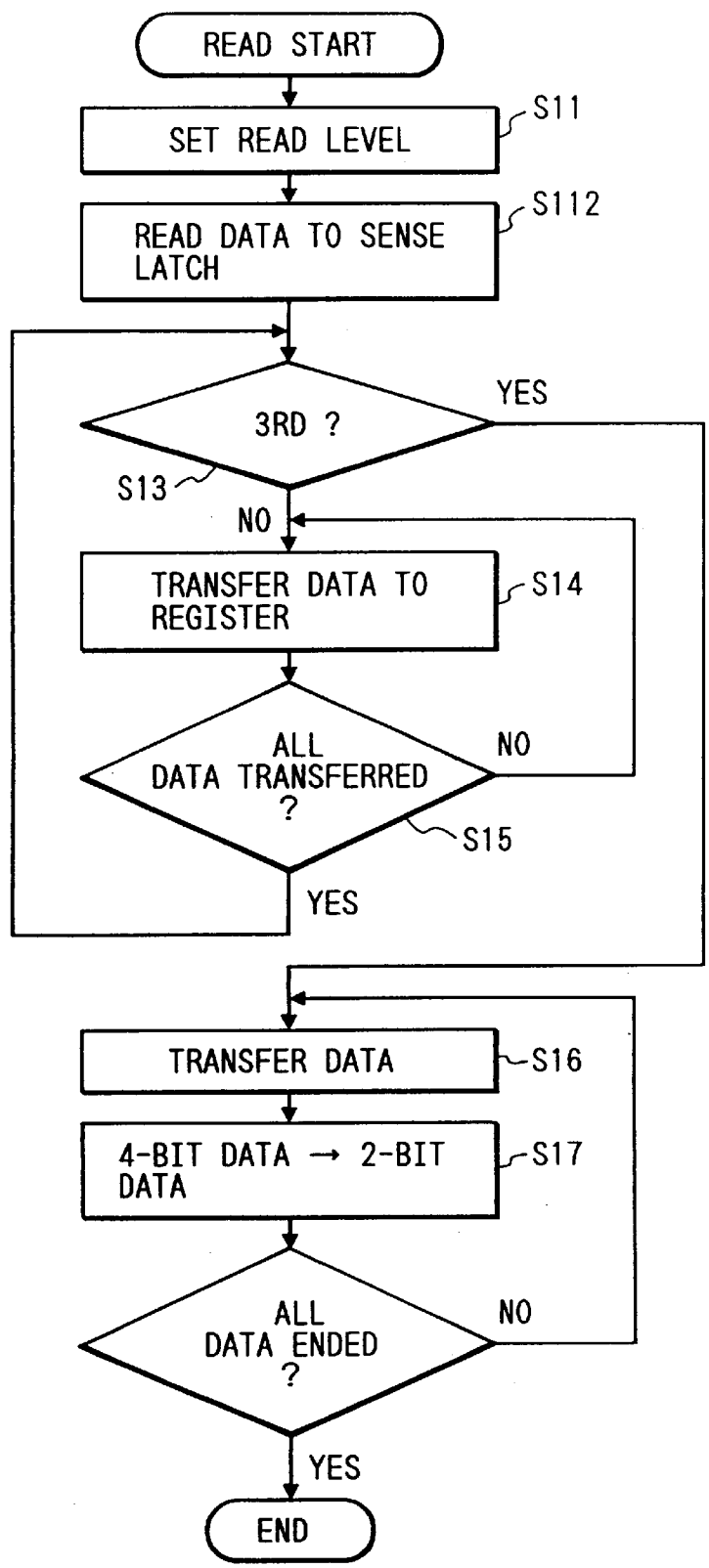
FIG. 8 is a flow chart showing a reading procedure of the multi-value flash memory of the embodiment.
Figure 14:
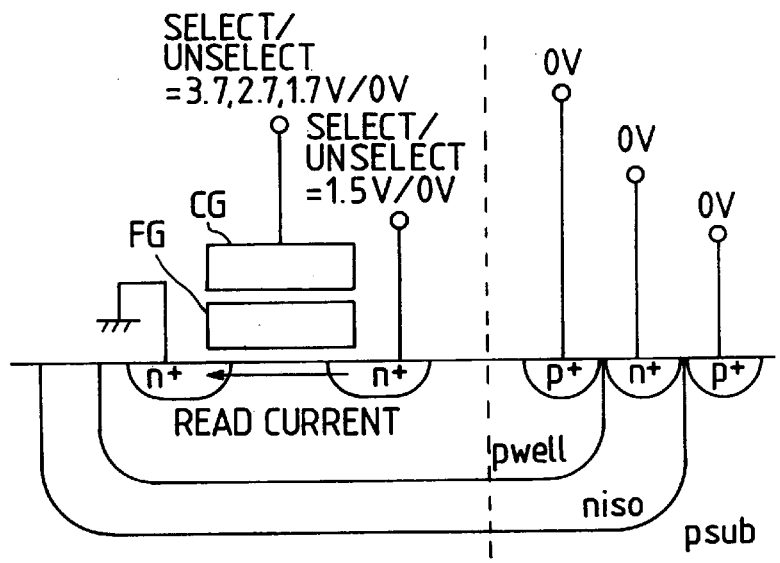
FIG. 14 is a diagram showing the voltage state at the reading time of the memory cell used in the flash memory of the embodiment.

Next, the reading operation of the memory cells will be described with reference to FIGS. 8 and 9. The data reading operation is performed, as shown in FIG. 14, by raising the voltage of the word line to apply a voltage of the selected level, such as 3.7 V, 2.7 V or 1.7 V, to the control gate CG of the memory cell, or a voltage of 1.5 V to the drain through the bit line. The reading operation is executed by programming the command for ordering a reading operation in the command register 16.

When the reading operation is started, the read level is set at first to the highest level of 3.7 V to energize the word line (at Step S11). Then, in the selected memory cell, data will appear on the bit line in accordance with the word line reading voltage level, so that the data are read out by amplifying the bit line level by the sense latch circuit 13 (Step S12). Next, the subsequent steps are different depending upon whether the reading is the first, second or third reading (Step S13). Specifically, when the reading is the first reading, the read data in the sense latch circuit 13 are transferred Lo the binary data register REG1 (Step S14).

When the transfer of all the read data in the sense latch circuit 13 has ended, the routine returns from Step S15 to Step S11, at which the second data reading operation is executed by setting the read level to 2.7 V to transfer the read data to the binary data register REG2. At the end of the second data read and transfer, the third data reading operation is performed by setting the read level to 1.7 V, and the routine moves from Step S13 to Step S16, at which the read data are transferred directly to the inverse transforming logic circuit 14. Moreover, the data, latched in the binary data registers REG1 and REG2, are individually transferred bit by bit to the inverse transforming logic circuit 14, in which there is executed a logic operation for transforming the quaternary data into two bit data (Step S17). Moreover, the foregoing procedure (Steps 16 to 18) is repeated to end the reading operations till the transfer and transformation of all the data in the sense latch circuit 13 are ended. The data transformation is effected by executing the operation of FIG. 2.

Figure 9:
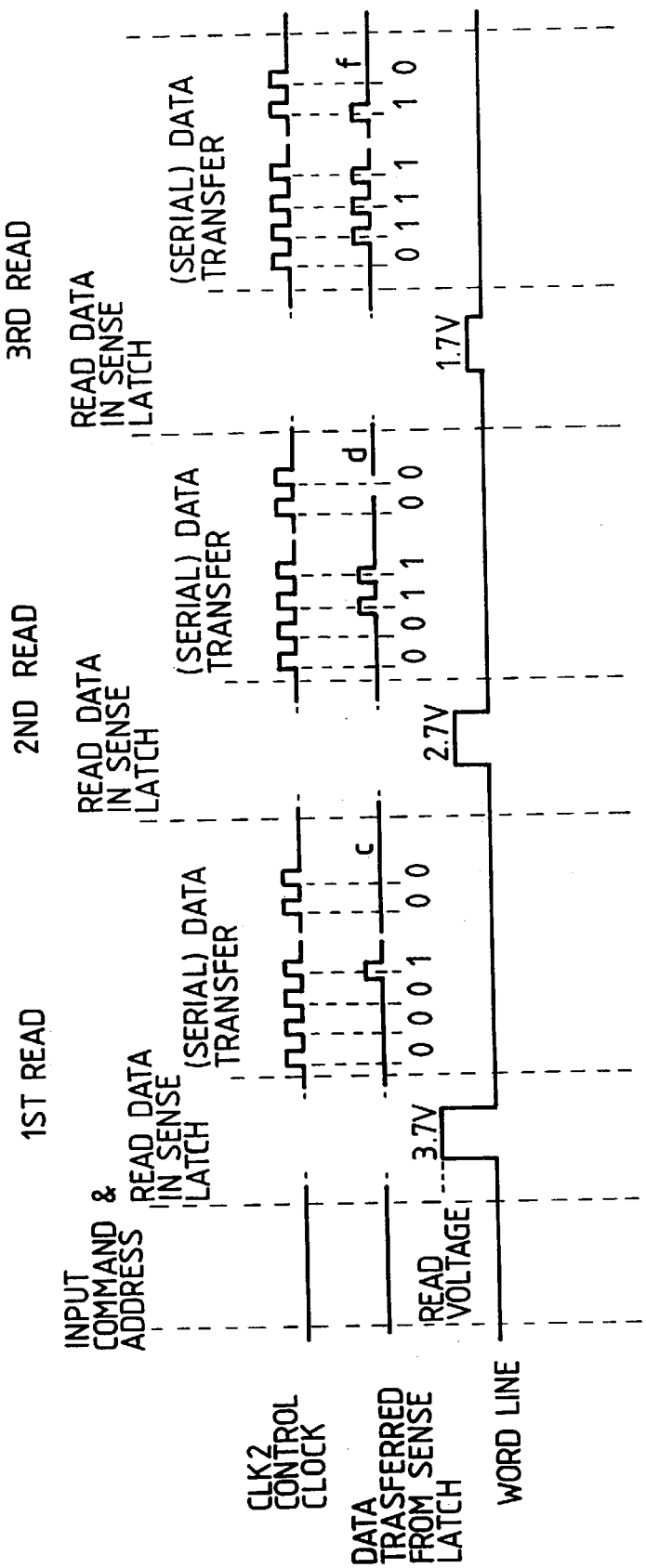
FIG. 9 is a timing diagram showing the reading operation waveforms of the multi-value flash memory of the embodiment.

FIG. 9 shows the timings of the control clock CLK2 in the reading operation according to the aforementioned procedure, the data to be transferred from the sense latch circuit 13, and the read level of the word line. When the read command and the address are fed from the outside, the reading operation is started to set the first read level (3.7 V) at first thereby to activate the word line, so that the data will appear on the bit line. The data "c", having appeared in response to the first word line level 3.7 V, are read out by the sense latch circuit 13 and are transferred to the first binary data register REG1 having a data width equal to n bits, which represents the data length of the sense latch.

Next, the data "d", produced by lowering the word line level by a predetermined value to the second read level 2.7 V, are transferred to the second binary data register REG2. The data "f", produced by lowering the word line to the third read level 1.7 V, are transferred to the inverse transforming logic circuit 14 so that the aforementioned quaternary data "c", "d" and "f" are changed again to two-bit data and outputted to the outside, such as to the CPU.

FIG. 10 shows the relation between an example of the entire construction of the multi-value flash memory MDFM having on the common semiconductor chip the aforementioned data transforming/inverse-transforming circuit, and a controller CONT connected, with the flash memory MDFM. This controller CONT may have only an address generating function and a command generating function for the multi-value flash memory of the present embodiment, so that a general purpose microcomputer can be used.

In FIG. 10, the circuit components designated by same reference symbols of FIG. 4, have the identical functions. Specifically, the symbols REG1 and REG2 designate binary data registers for holding the program data of two bits; the numeral 11 designates a data transforming logic circuit for transforming the held two-bits data into quaternary data; the numeral 12 designates a memory array provided with non-volatile memory elements having a floating gate, such as a FAMOS in a matrix form; the numeral 13 designates a sense latch circuit for latching the read data and the program data; the numeral 14 designates inverse transforming logic circuit for transforming the quaternary data read out from the memory array into two-bits data; the numeral 16 designates a command register for latching the command fed from the controller CONT; the numeral 17 designates a command decoder for decoding the command code held in the command register 16; and the numeral 18 designates a sequencer for sequentially generating and outputting the control signals for the individual circuits in the memories to execute the processings corresponding to the commands.

The multi-value flash memory of this embodiment is equipped with two memory arrays, although the invention is not especially limited thereto, and individual sense latch circuits 13 are provided for the respective memory arrays. These individual sense latch circuits 13 are constructed to simultaneously amplify and latch the data of the memory cells of one line sharing the word line in the memory array, so that the read data latched in the sense latch circuits 13 are selected by a common Y-decoder 15 and transferred bit by bit or in units of a byte to an output register 19. The read data latched in the output register 19 are outputted to the external CPU or the like through a buffer circuit 22. The sense latch circuit 13 of the embodiment of FIG. 4 performs a shift operation during the data transfer and is required to have a function similar to that of the shift register. However, the sense latch circuits 13 can have no shift function by providing a construction, as in FIG. 10, in which the data are selected in response to the Y-decoder 15 and in which this Y-decoder 15 shifts the selected bit by the clock signal.

The multi-value flash memory of this embodiment is constructed to include, in addition to the above-specified individual circuits, an all decision circuit 20 for deciding whether or not the data read out from the memory array 12 and fed to the sense latch 13 are all "0" or all "1"; a buffer circuit 21 for fetching external control signals, such as a reset signal RES, a chip select signal CE, a program control signal WE, an output control signal OE, a system clock SC and a command enable signal CDE indicating whether the input is a command input or an address input, all signals being fed from the controller CONT; a buffer circuit 22 for fetching an address signal and a command signal; an internal signal generator 23 for generating a control signal for an internal circuit on the basis of the external control signal; an address register 24 for latching the address which has been held in the buffer circuit 22; a data register 25 for latching the input data; X-address decoders 26a and 26b for decoding the fetched address to generate a signal and for selecting the word line in the memory array 12; a word driver 27; an internal power source generator 28 for generating voltages required in the chip, such as the substrate potential, the program voltage, the read voltage and the verify voltage; a switching circuit 29 for selecting a desired voltage from those voltages in accordance with the operating state of the memory and feeding the selected voltage to the main decoder 27 and the like; a clock generator 30 for generating the internal clock signal (CLK2 and the like); a timer circuit 31 for counting the clock pulses to give times, such as a program pulse width; a status register 32 for indicating the control state of the memory by the sequencer 16; a Y-address counter 33 for updating the Y-address automatically; a false address register 34 for latching the position (address) of a false bit; a redundancy comparator 35 for comparing the Y-address and the false address; and a relieved address register 36 for storing a relieved address to switch the selected memory column when the address coincides. Moreover, the multi-flash memory of this embodiment is constructed to output a ready/busy signal R/B* for indicating whether or not the memory can be accessed from the outside.

Moreover, the multi-value flash memory of this embodiment is given a function (hereinafter referred to as the refresh function) to sharpen the bell-shaped variation distributions of the threshold values when the shapes broaden and lower due to the disturb or the retention influences (see FIG. 3). This refresh function is activated when a command is fed from the outside as in the programming or erasing operation. If the refresh command is fetched by the command register 16, the sequencer 18 of the micro program control type is started to effect the refreshing operation. This refreshing operation will be described in detail hereinafter. The signal indicating the decision result of the aforementioned all decision circuit 20 is fed to the sequencer 18. In the refreshing mode, the all decision circuit 20 decides that the read data are all "0". When a signal indicating this decision result is fed to the sequencer 18, the sequencer 18 stops the refreshing operation. At the data erasing time, on the other hand, the sequencer 18 stops the erasing operation if the aforementioned all decision circuit 20 decides that the read data are all "1".

In this embodiment, moreover, there is adopted predecode system in which the X-address decoder decodes the address signal at the two stages by means of the predecoder 26a and the main decoder 26b. The desired word line is selected, for example, by decoding the more significant three bits of the X-address at first using the predecoder 26a and by controlling the word driver 27 with the predecode signal. By adopting such a predecode system, the unit decoders constituting the main decoder 26b can be arranged in a high integration state according to the word line pitch of the memory array thereby to reduce the chip size.

Figure 11:
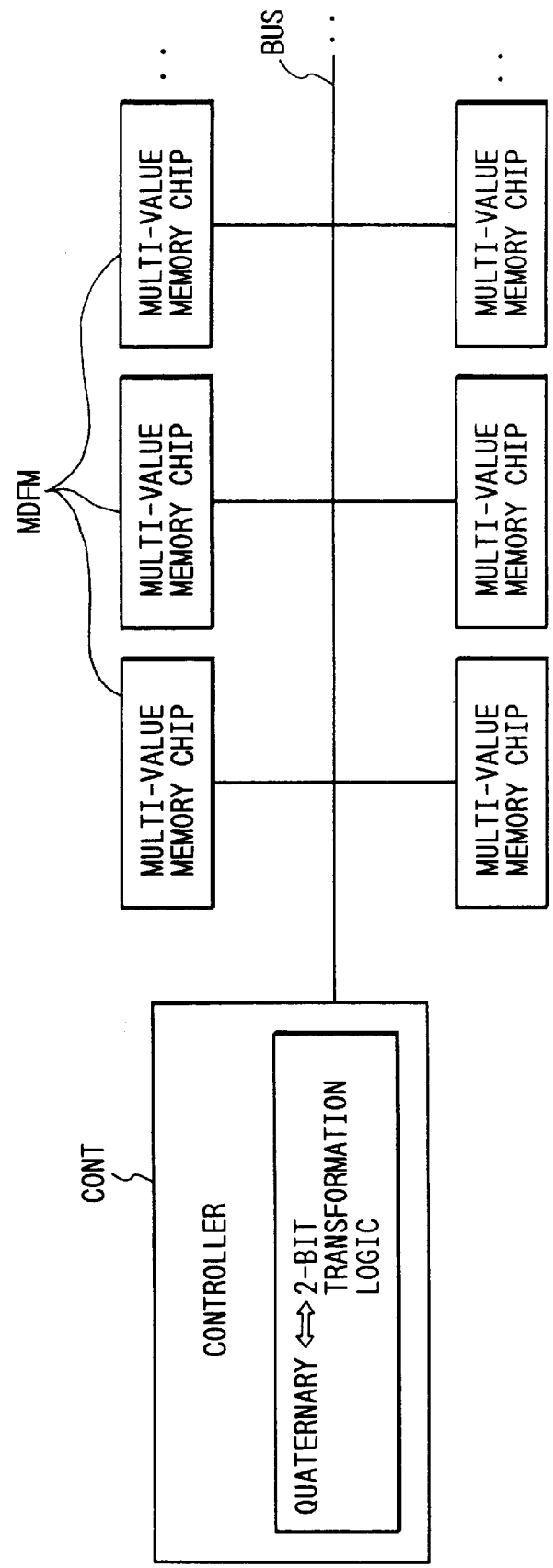
FIG. 11 is a block diagram showing an example of the system construction of an embodiment in which a controller is given a function to transform two-bits data intrinsic to the multi-value memory and quaternary data.

Incidentally, the multi-value flash memory of the aforementioned embodiment is equipped on the common silicon substrate, as shown in FIGS. 4 and 10, with the function circuits 11 and 14 for transforming two-bits data into quaternary data and vice versa. However, a dedicated controller unit having those functions can be separately provided. In this modification, the flash memory chip need not be provided with the functions intrinsic to the multi-value, so that its chip area does not increase. Another advantage is that a plurality of flash memories MDFM can be connected to a single controller unit CONT and controlled by a bus BUS, as shown in FIG. 11. This controller unit is constructed to have an address generating function and a command generating function in addition to the aforementioned data transforming/ inverse-transforming functions.

Figure 15:
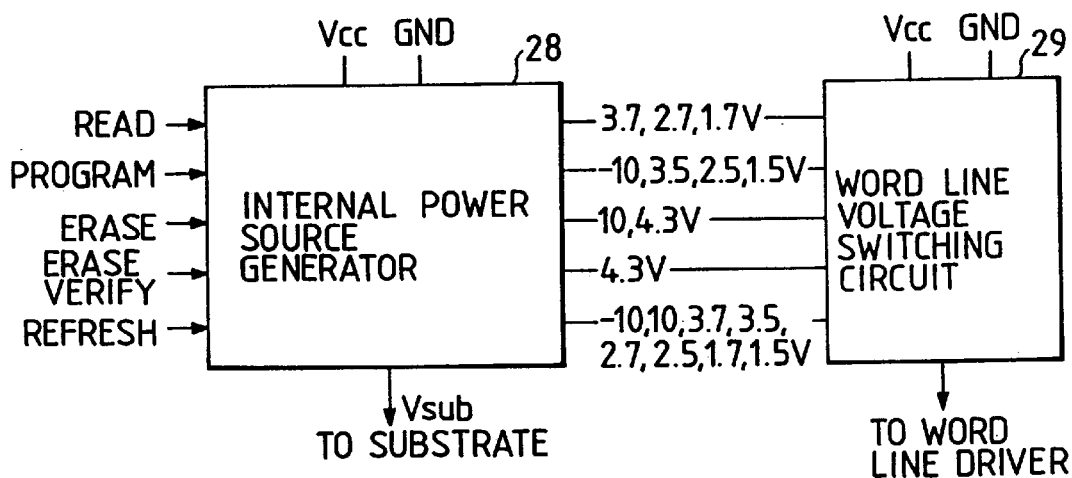
Figure 16:
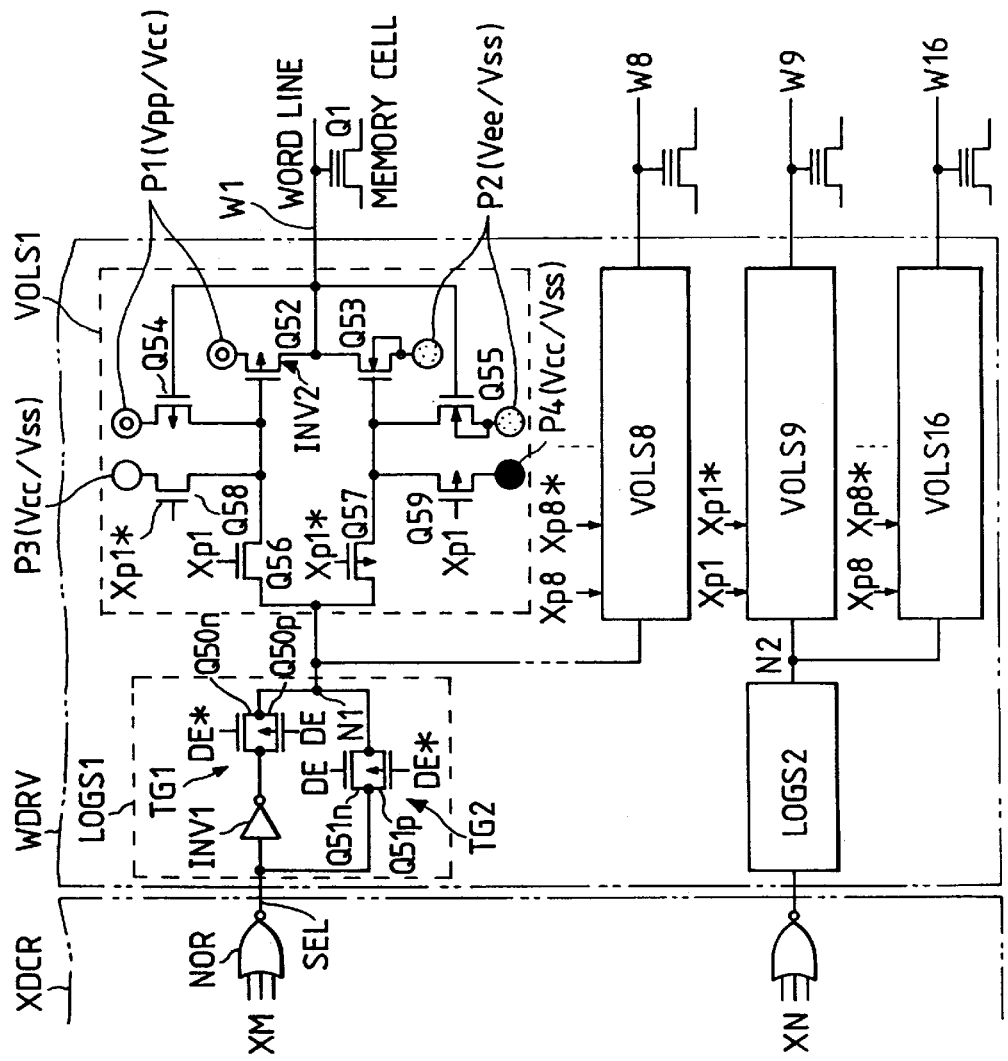
FIG. 16 is a schematic circuit diagram showing an example of the construction of the word driver.

FIG. 15 shows the internal power source generator 28 for generating the word line voltage and a substrate potential Vsub and the switching circuit 29 for selectively feeding them to the word driver 27 and the like, and FIG. 16 shows an example of the construction of the word driver 27. The internal power source generator 28 generates the necessary word line voltages in response to the internal control signals which are generated from the sequencer 18 correspondence to the various operation modes. The construction of the internal power source generator 28 for generating voltages including the word line voltage and the construction of the switching circuit (the word line voltage switching circuit) 29 for receiving the generated voltages are similar to those of the prior art except that the kinds of the voltage values of the word line are increased for the multi-value operation.

Specifically, there are four kinds of word line voltages necessary for the binary flash memory of the prior art: the read voltage (2.7 V, 0 V); the program voltage (−10 V, 0 V); the program verify voltage (1.5 V); the erase voltage (+10 V, 0 V) and the erase verify voltage (4.3 V, 0 V). On the contrary, the word line voltages necessary for the multi-value flash memory of the present embodiment are: the read voltage (3.7 V, 2.7 V, 1.7 V, 0 V); the program voltage (−10 V, 0 V); the program verify voltage (3.5 V, 2.5 V, 1.5 V); the erase and erase verify voltages (10 V, 4.3 V, 0 V); and the refresh voltage (−10 V, 10 V, 3.7 V, 3.5 V, 2.7 V, 2.5 V, 1.7 V, 5 V, 1.5 V, 0 V).

The aforementioned switching circuit 29 receives the internal control signals, which are generated by the sequencer 18 and correspond to the various operation modes, and feeds the voltages, generated by the aforementioned internal power source generator 28, to the power terminals P1 and P2 of the word driver 27 which is constructed as shown in FIG. 16.

The word driver used WDRV of FIG. 16 is a driver used when the word line predecoding method is adopted. Eight voltage selectors VOLS1 to VOLS8 have their inputs connected in common to the output node N1 of a logic selector LOGS1, and eight voltage selectors VOLS9 to VOLS16 have their inputs connected in common to the output node N2 of a logic selector LOGS2, so that the individual voltage selectors may be selected by predecode signals Xp1 and Xp1* to Xp8 and Xp8*. Signals XM and XN together with the predecode signals xp1 and Xp1* to XpB and Xp8* are fed from an address decoder XDCR (26b). At this time, the voltage selectors VOLS1 to VOLS16 have to select and feed the same voltage to the word line as that which is unselected by the other logic selector, unless the operation is selected by the predecode signal even if either logic selector LOGS1 or LOGS2 corresponding to the voltage selectors outputs the select signal of the select level.

For these operations, separating MOSFETs Q56 and Q57 are switched by the predecode signal. In order that a voltage in the unselected state may be outputted to the word line when the separating MOSFETs Q56 and Q57 are cut off, there are further provided a pull-up MOSFET Q58 and a pull-down MOSFET Q59 which can be switched complementarily with the separating MOSFETs Q56 and Q57 to feed a predetermined voltage to each input of the output circuit INV2.

In FIG. 16, the aforementioned signal XM is deemed to be a three-bit signal for indicating which word lines out of the eight word line groups each including eight word lines is to be selected. The predecode signals Xp1 and Xp1* to Xp8 and Xp8* are deemed to be complementary signals for indicating which word line contained in each word line group is to be selected. According to the present embodiment, the high level of the select signal SEL is the select level, and the high and low levels of each of the predecode signals Xp1 and Xp1* to Xp8 and Xp8* are the select level.

The voltage to be fed to the terminal P1 of the aforementioned word driver WDRV is a voltage Vpp to be used for the erasing, programming, verifying and reading operations, such as 5 V, 4.3 V, 3.7 V, 3.5 V, 2.7 V, 2.5 V, 1.7 V, 1.5 V or 0 V. The voltage to be fed to the terminal P2 is either a voltage Vee to be used for the programming and refreshing operations such as −10 V or a voltage Vss as the ground potential or the reference potential of the circuit, such as 0 5 V.

Each of the aforementioned logic selectors LOGS1 and LOGS2 is constructed to include: an inverter INVL for inverting the signal of the X-decoder XDCR; a transfer gate TG1 for transmitting or blocking the output of the inverter INV1; and a transfer gate TG2 for transferring or blocking the signal of the X-decoder XDCR.

The aforementioned voltage selectors VOLS1 to VOLS16 are made to have identical constructions, each of which is made, as represented by the voltage selector VOLS1, of: an N-channel type pull-up MOSFET Q58 connected between a terminal P3 and the gate of a MOSFET Q52 and switched by the predecode signal Xp1*; and a P-channel type pull-up MOSFET Q59 connected between a terminal P4 and the gate of a MOSFET Q53 and switched by the predecode signal Xp1. The voltage selector VOLS1 switches the separating MOSFET Q56 by using the predecode signal Xp1 and the other separating MOSFET Q57 by using the predecode signal Xp1*. The aforementioned terminals P3 and P4 are fed with the voltage Vcc or Vss.

Next, the operations of the word driver WDRV of FIG. 16 will be described. Table 1 shows the voltages at the terminals and the word line voltages in the individual operation modes. The description of the manner in which to set the program mode, the erase mode and the read mode will be omitted.

When the erase mode is specified by the command, the switching circuit 29 feeds the voltage Vpp to the terminal P1, the voltage Vss to the terminal P2, and the voltage Vcc to the terminals P3 and P4, and the control signal DE is set to the low level.

On the other hand, all the bits of the signal XM are set to the low level, so that any of word lines Wi to W8 can be selected. As a result, when the select signal SEL at the select level (the high level) is fed, the node N1 is set to the low level through the inverter INVL and the transfer gate TG1 so that this low level is fed to the inputs of the individual voltage selectors VOLS1 to VOLSB. When the memory cell to be erased is coupled to the word line W1, only the signals Xp1 and Xp1* of the predecode signals Xp1 and Xp1* to XpS and XpS* are set to the high level and the low level, respectively.

Therefore, the separating MOSFETs Q56 and Q57 of only the voltage selector VOLS1 are turned on, so that the signal at the node N1 is fetched by the voltage selector VOLS1. At this time, both the pull-up MOSFET Q58 and the pull-down MOSFET Q59 of the voltage selector VOLS1 are cut off.

As a result, the signal of the node N1 is fed to the MOSFETs Q52 and Q53 of the voltage selector VOLS1. Then, the MOSFET Q52 of the output circuit INV2 is turned on, and hence the word line W1 begins to be charged by the voltage Vpp at the terminal P1. At this time, the low level to be fed to the gate of the other MOSFET Q53 is raised to a low level higher than the initial voltage Vss by the action of the MOSFET Q57, so that the MOSFET Q53 is not completely cut off. However, when the conductance of a feedback MOSFET Q55 is increased with the rise of the level of the word line W1, the voltage of the gate of the MOSFET Q53 is forced to the voltage Vss, and it is completely cut off.

In the erase mbde, therefore, the word line W1, to which is coupled the selected memory cell, is charged to the level Vpp.

While the select signal SEL is at-the high level, as described above, the predecode signals Xp1 and Xp1* are set to the low level and-the high level, respectively, if the memory cell Q1 of the word line W1 is not selected for the erasure. As a result, both separating MOSFETs Q56 and Q57 of the voltage selector VOLS1 are turned off to fetch no signal from the node N1. At this time, both pull-up MOSFET Q58 and pull-down MOSFET Q59 of the voltage selector VOLS1 are turned on.

As a result, the gates of the MOSFETs Q52 and Q53 of the voltage selector VOLS1 are fed with the voltage Vcc from the terminals P3 and P4 through the MOSFETs Q58 and Q59. As a result, the MOSFET Q53 of the output circuit INV2 is turned on, so that the word line W1 begins to be discharged to the voltage Vss through the terminal P2. At this time, the high level fed to the gate of the other MOSFET Q52 is lower than the voltage Vcc by the threshold voltage of the MOSFET Q58, so that the MOSFET Q52 is not completely cut off. As the level of the word line W1 is lowered by the ON MOSFET Q53, the conductance of the feedback MOSFET Q54 is increased, and the gate of the MOSFET Q52 is forced to the voltage Vpp, so that it is

TABLE 1

|  | SELECTED | UNSELECTED | XM | Xp | DE | P4 • | P1 ⊙ | P3 ○ | P2 ⊚ | WORD LINE |
|---|---|---|---|---|---|---|---|---|---|---|
| ERASE | ○ |  | L | H |  |  |  |  |  | Vpp |
|  |  | ○ | H | H | L | Vcc | Vpp | Vcc | Vss | Vss |
|  |  | ○ | L/H | L |  |  |  |  |  | Vss |
| PROGRAM | ○ |  | L | H |  |  |  |  |  | Vee |
|  |  | ○ | H | H | H | Vss | Vcc | Vss | Vee | Vcc |
|  |  | ○ | L/H | L |  |  |  |  |  | Vcc |
| READ | ○ |  | L | H |  |  |  |  |  | Vcc |
|  |  | ○ | H | H | L | Vcc | Vcc | Vcc | Vss | Vss |
|  |  | ○ | L/H | L |  |  |  |  |  | Vss | completely cut off. In the erase mode, therefore, the unselected word line W1 is discharged to the voltage Vss.

The operation of the word driver WDRV when the program mode or the read mode is specified, will not be described in detail because it is similar to the operation of the aforementioned program mode. However, the word lines are so driven by the voltages applied to the terminals P1 and P2 from the switching circuit 29 that the voltages, as shown in FIGS. 13 and 14, may be applied to the selected memory cells.

Figure 17:
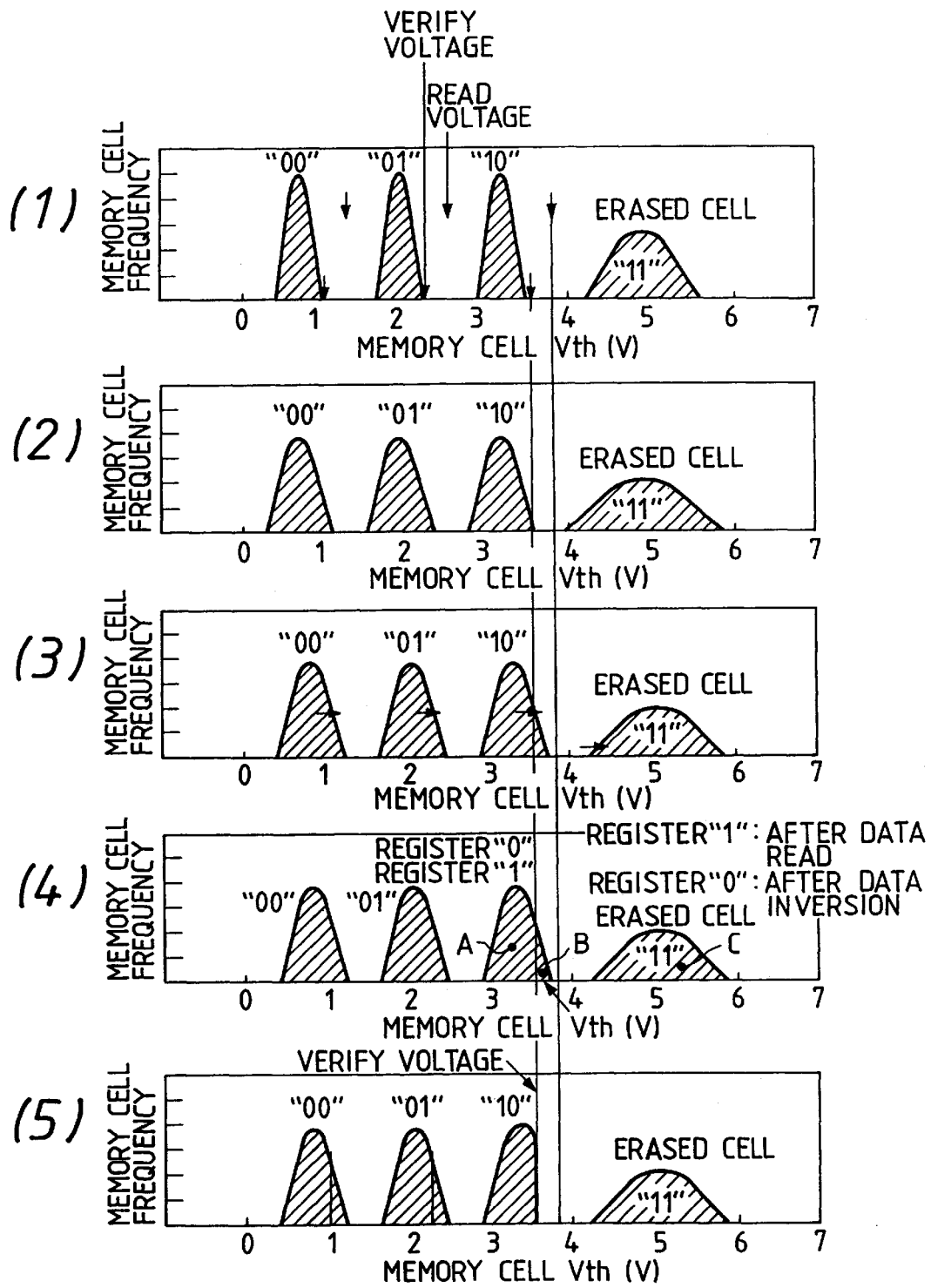
FIG. 17 is an explanatory diagram showing a method of an embodiment for refreshing the multi-value 20-flash memory.

Next, the refreshing operation, which is a second feature of the multi-value flash memory of the present invention will be described with reference to FIG. 17. For the multi-value flash memory which is first programmed with the data, the bell-shaped variation distributions of the threshold values are completely separated, as shown in FIG. 17(1). However, the threshold value variations are increased as shown in FIG. 17(2), as the subsequent programming, reading and standby state operations are repeatedly executed.

This is caused by the so-called influence, in which when a memory cell adjacent to a certain memory cell is programmed, this memory cell is also weakly programmed, and by the retention influence which is caused by the natural leakage at the standby time. This phenomenon may occur even in an ordinary flash memory for storing only one bit, but may cause a malfunction in the multi-value flash memory in which the intervals between the individual threshold values are narrow, as in the foregoing embodiment.

In the present embodiment, therefore, there is executed a refreshing operation for sharpening the peaks (see FIG. 3) of the variation distributions of the threshold values when the peaks are broadened and lowered.

Next, the procedure of the refreshing operations will be described.

Figure 18:
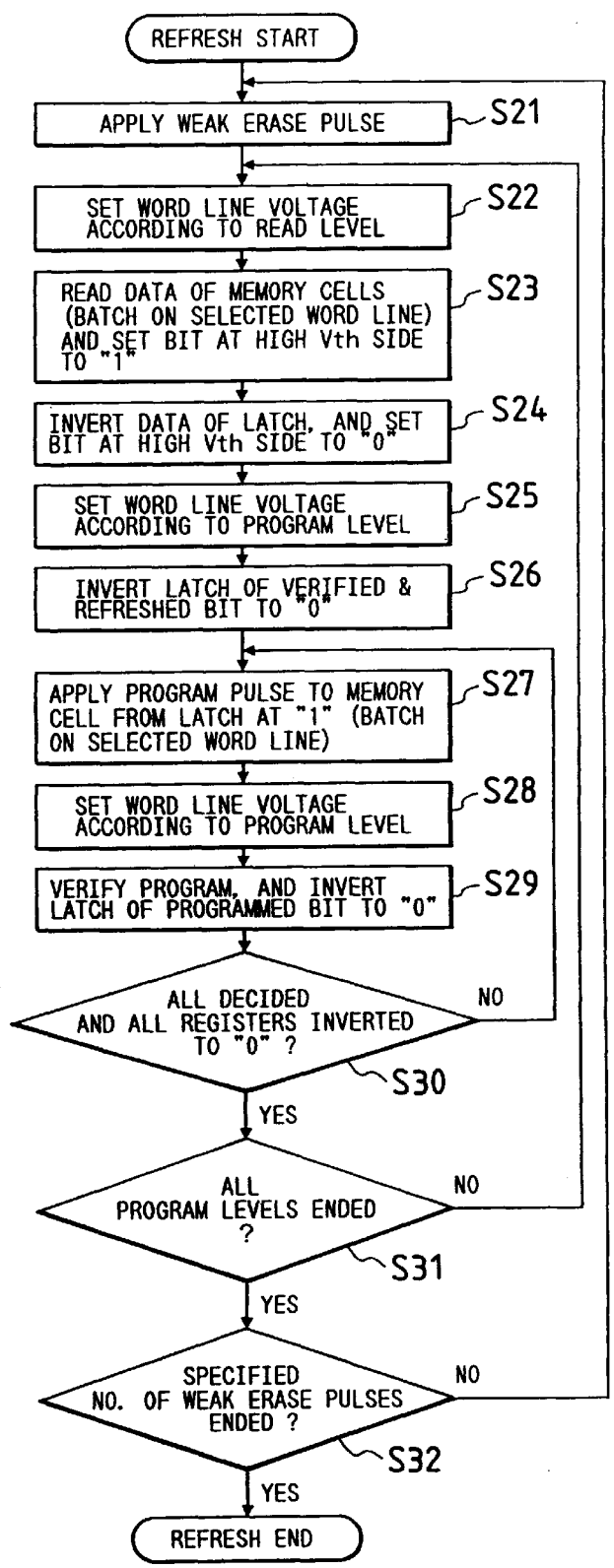
FIG. 18 is a flow chart showing a refreshing procedure of the multi-value flash memory of the embodiment.

FIG. 18 is a flow chart showing the procedure of the refreshing operation. When the refresh command is inputted from the external CPU or the like, the sequencer 18 is started to begin the refreshing operation according to the flow chart of FIG. 18. When the refreshing operation is started, a weak erase pulse is applied at first from the word line to all the memory cells which are connected to the selected word line (Step S21). As a result of this application of the weak erase pulse, the threshold values of all the memory cells are slightly shifted to the higher side, as shown in FIG. 17(3). This shift is about 0.2 V, although the invention is not especially limited thereto. Here, the term, weak erase pulse, refers to a sufficiently short pulse that the memory cell threshold value at "10", for example, may not exceed, if added, just the higher read level 3.7 V. The pulse width is experimentally determined according to the amount to be shifted.

At the second stage, the word line voltage is set to the read level (3.7 V) corresponding to the stored data "10" (Step S22) thereby to effect the reading operation. As a result, data are read out according to the threshold values of the individual memory cells (Step S23) and are amplified and latched by the sense latch circuit 13. At this time, the data of the sense latch corresponding to the memory cell having a higher threshold value than the word line voltage is set to "1", and the data of the sense latch corresponding to the memory cell having a lower threshold value than the word line voltage is set to "0". Next, the data of the sense latch are inverted (Step S24). This data inversion can be easily carried out (as will be described hereinafter) by the sense latch circuit having the construction shown in FIG. 20.

Next the word line is set to a lower verify voltage (3.5 V at first) which is lower than the aforementioned read level (Step S22) so that the judgment of the threshold value is executed (Step S25). As a result, the data of the sense latch corresponding to the memory cell (designated by letter A in FIG. 17(4)) having a lower threshold value than the verify voltage are switched from "0" to "1". On the contrary, the data of the sense latch corresponding to the memory cell (designated by letter B in FIG. 17(4)) having a higher threshold value than the verify voltage are left at "1". These data are judged to be targets to be re-programmed in the present embodiment. This specifies the memory cells which have excessively approached the read level (3.7 V) when the threshold value is shifted to the higher side by the weak erasure at Step S21. Incidentally, the data of the sense latch, which corresponds to the memory cell (designated by letter C in FIG. 17(4)) corresponding to the stored data "11" having the highest threshold value, are left at "0" set by the aforementioned inverting operation. Such an operation can be automatically executed by a sense latch circuit which has the construction shown in FIG. 20 (as will be described hereinafter).

Therefore, the memory cell (designated by letter B in FIG. 17(4)) having the data "1" of the sense latch is reprogrammed by setting the program voltage (Step S27). After this, the verification is executed by setting the verify voltage corresponding to the program level (Step S28, S29). When the threshold value becomes lower than the verify voltage, the latch data change from "1" to "0". The programming and verifying operations are repeated to end the refresh procedure of the memory cell having the data "10", till all the latch data change to "0". As a result, the variation distribution (the half-value width) of the threshold value of the memory cell of the data "10" becomes low, as indicated in FIG. 17(5). From that point on, similar refreshing operations are executed, too, for the memory cells for storing the data "01" and "00" (Step S31). In order to make the width of the distribution shape of the threshold value, the operations of Steps 21 to 31 are repeated to complete the refresh operation (Step S32) when a predetermined number of operations are ended.

Table 2 shows the changes in the latched data of the sense latch which occur sequentially when the memory cells having the threshold values indicated by letters A, B and C of FIG. 17(4), are read out, when the refreshing is executed according to the procedure described above.

TABLE 2

|        | READ | INVERSION | VERIFY | END |
|--------|------|-----------|--------|-----|
| CELL A | 0    | 1         | 0      | 0   |
| CELL B | 0    | 1         | 1      | 0   |
| CELL C | 1    | 0         | 0      | 0   |

Figure 19:
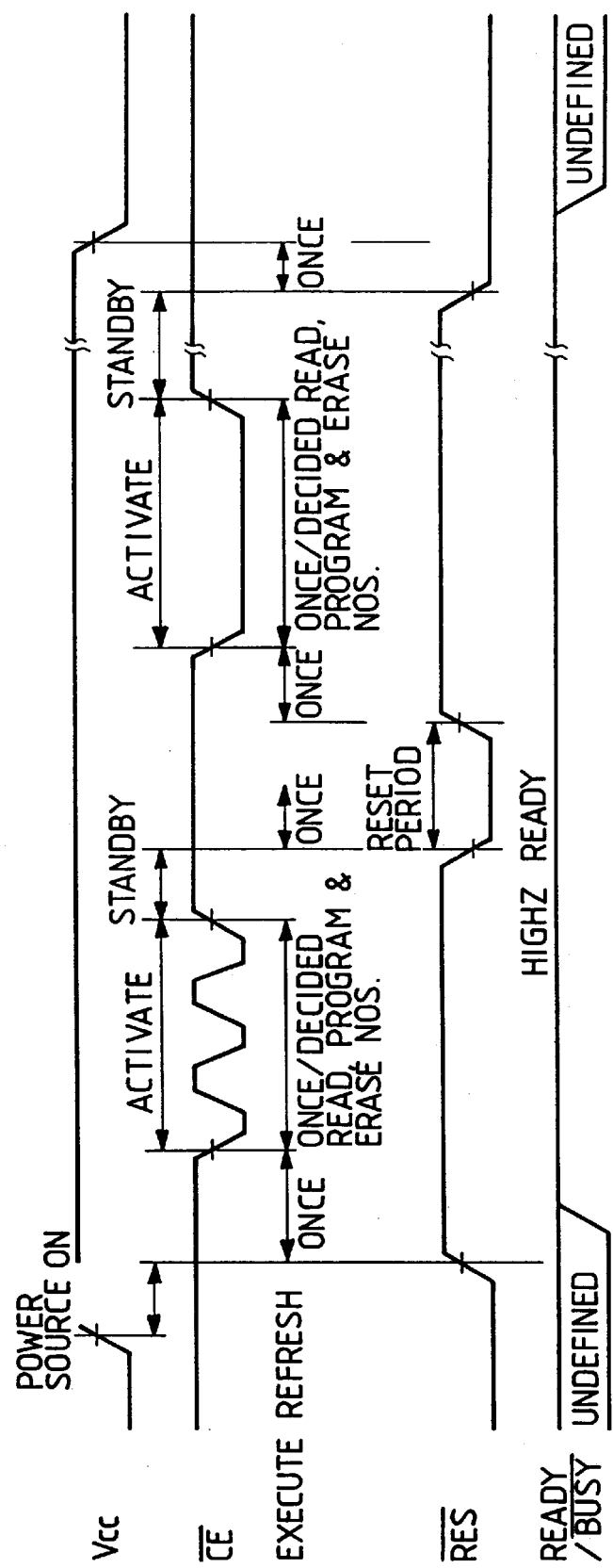
FIG. 19 is a timing diagram showing the operation waveforms at the refreshing time.

FIG. 19 is a diagram showing the timings at which the refreshing operations are executed. As described above, the causes of enlarging the variations of the threshold values of the memory cells are influenced due to the execution of the weak programming, erasing and reading operations of a memory cell adjacent to a memory cell if this memory cell is programmed or read, and the retention influence due to the natural leakage.

The timings at which the refreshing operations against the fluctuation of the threshold values due to the influence are executed are as follows.

(1) The refreshing operations are executed when the flash memory is in a standby state (/RES is at the high level)

and after a predetermined number of programming/ erasing and reading operations are completed.

(2) The refreshing operations are executed immediately after the reset signal (/RES) is activated at the resetting time.

(3) The refreshing operations are executed immediately after the reset state is caused by setting the /RES to the low level from the standby state.

(4) The /RES is set to the low level immediately before the power supply is turned off, so that the refresh is executed by sensing the off condition.

(5) The refresh is executed after the power supply is turned on to set the /RES to the high level.

As counter-measures for the reduction of the threshold values due to the retention influence, on the other hand, it is conceivable to execute the refresh operation at predetermined periodic intervals in the course of the dummy cycle or in the standby state when the power supply is turned on. All of these refresh timings may be executed, but any one or only some of them also may be executed.

Incidentally, the refreshing operations described above should not be limited to the multi-value flash memory. As it is considered that the power supply voltage of the flash memory will change to a lower voltage, however, an increase in the variation of the threshold value cannot be ignored even in an ordinary flash memory, so that the refreshing operation is an effective function as a counter-measure against the lower power supply voltage of the flash memory.

Figure 20:
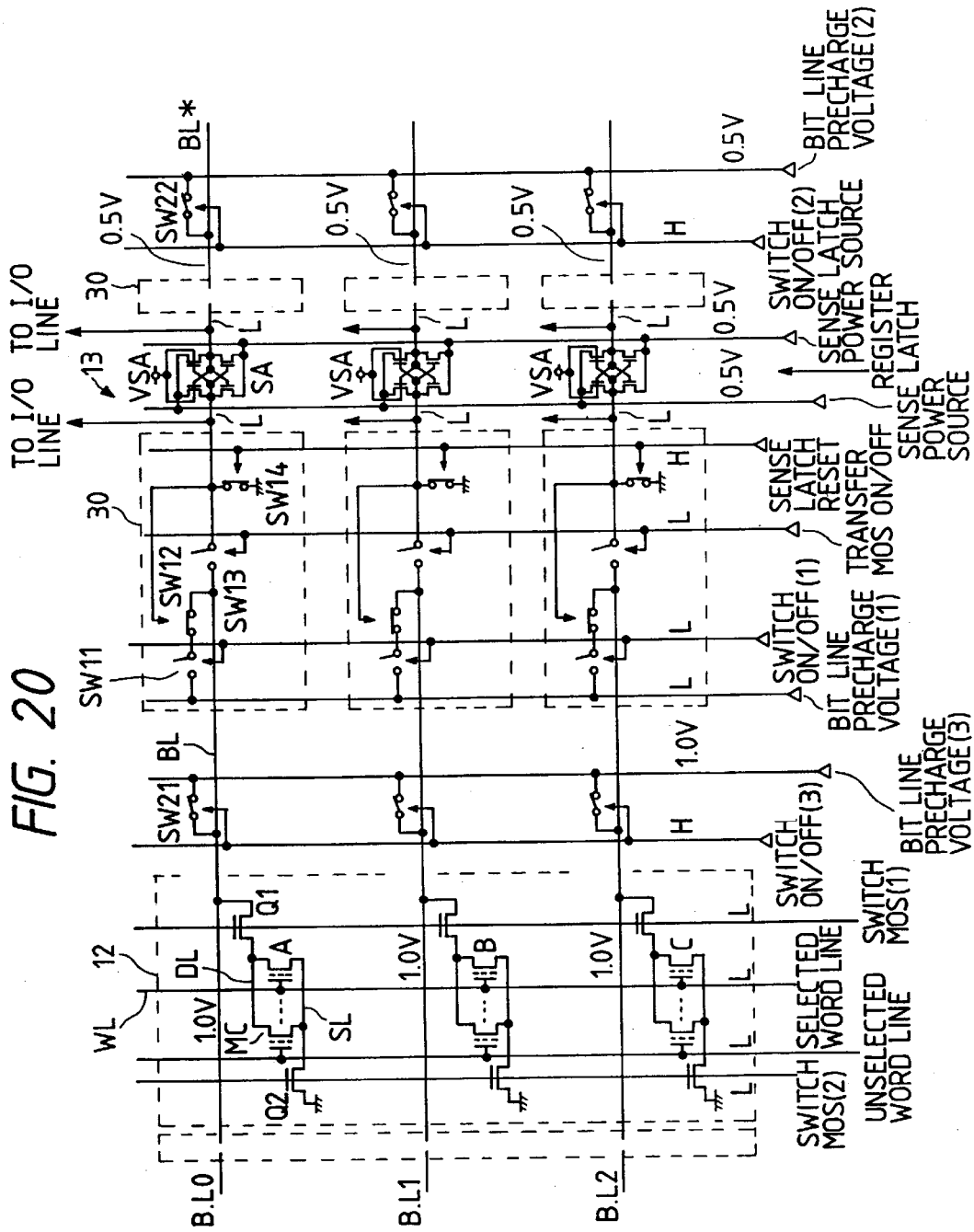
FIG. 20 is a schematic circuit diagram showing an example of the construction of a sense latch circuit of an embodiment.

FIG. 20 shows an example of the construction of the memory array 12 and the sense latch circuit 13. The memory array 12 is an AND type, in which a plurality of memory cells MC (e.g., one hundred and twenty eight for one hundred and twenty eight batch-erasable word lines) are connected in series between a common drain line DL, provided in parallel with the bit lines BL arranged perpendicularly to the word lines and adapted to output the read signal of the selected memory cell, and a common source line SL. The common drain line DL can be connected to the corresponding bit line BL through the switch MOSFET Q1, and the common source line SL can be connected to the grounding point through the switch MOSFET Q2. The gate control signals for those switch MOSFETs Q1 and Q2 are generated on the basis of the X-address signal and the read/write control signal. The switch MOSFETs Q1 and Q2 are turned on to discharge the bit lines through the ON memory cells by setting the gate control signals to a potential such as Vcc (3.3 V) at the data reading time (including the verifying time). At the data programming time, on the other hand, the gate control signal for the switch MOSFET Q1 is set to a potential such as 7 V and turned on because the program voltage (5 V) of the bit lines is transmitted to the drains of the memory cells. At this time, the switch MOSFET Q2 on the common source line SL side is turned off.

The sense latch circuit 13 is constructed of a CMOS differential type sense amplifier SA disposed for each memory column for amplifying the potential difference between the bit lines of the right and left memory arrays. Prior to the reading operation, the bit line of the selected side (on the lefthand side) memory array is precharged to a potential such as 1 V by a precharge MOS (SW21), and the bit line on the opposite side memory array is precharged to a potential such as 0.5 V by a precharge MOS (SW22).

When the word line WL is set to the read level in this precharge state, the bit line retains 1.0 V if the selected memory cell has a high threshold value. However, if the selected memory cell has a low threshold value, an electric current flows to draw the charge on the bit line. so that the bit line takes a potential of 0.2 V. The potential difference between this potential of 1.0 V or 0.2 V and the potential of 0.5 V of the bit line on the opposite side is detected and amplified by the sense amplifier SA, so that the read data are latched in the sense amplifier SA.

In the foregoing embodiment, as described before, the sense latch (the sense amplifier) corresponding to the bit line connected to the memory cell to be programmed is set to "1", the program pulse (–10 V) is applied to the word line, and then the word line is set to the verify voltage (about 3.5 V for the first time) corresponding to the program level thereby reading the memory cell to which the program pulse is applied. Moreover, the read data "1" are read out from the insufficiently programmed memory cell to the bit line, and a program end or weak program is judged from the data read out, so that the data of the sense latch (the sense amplifier) whose bits are programmed are inverted to "0". In other words, the data "1" are left in the sense latch (the sense amplifier) corresponding to the insufficiently programmed memory cell, so that the program pulse may be applied again to the insufficiently programmed memory cell corresponding to the bit of "1".

In the refreshing operations, too, the data read out to the sense latch are inverted, and the verification is executed to apply the program pulse to the memory cell corresponding to the bit of "1".

The sense latch circuit of FIG. 20 is devised to have a inversion control circuit 30 which is interposed between the sense amplifier and the memory array and composed of four switches SW11, SW12, SW13 and SW14, so as to easily facilitate the inversion of the latch data of the sense amplifier corresponding to the memory cell, which has been programmed at the aforementioned programming time, and the narrowing of the memory cell to which the program pulse is to be applied.

Here will be described the operation of this sense latch circuit. Incidentally, the switches SW21 and SW22 disposed on the individual bit lines BL are switches for precharging the bit lines and are constructed of MOSFETS, similar to the aforementioned switches SW11 to SW14.

At the data reading time, the switch SW13 is turned off at first. With the bit line BL and the sense amplifier SA disconnected from each other, as shown in FIG. 20, the switches SW21 and SW22 are then turned on to charge the bit line BL on the selected side to a precharge level of 1.0 V.

At this time, the bit line on the unselected side is charged to the level of 0.5 V. Moreover, the sense amplifier SA turns on the switch SW14 to reset it and feed it a potential of 0.5 V. At this time, moreover, the switch MOSFETs Q1 and Q2 are turned on by impressing the voltage Vcc to their gates.

Then, any word line WL in the memory array is set to the select level of 3.7 V. Then, the memory cells (e.g., the cell A and B of FIG. 17) having a lower threshold value than the word line select level are turned on, so that the bit line BL connected to them is discharged to the level of 0.2 V by the electric current flowing to the common source line SL through the ON memory cells. on the other hand, the memory cell (e.g., the cell C of FIG. 17) having a higher threshold value than the word line select level is turned off, so that the bit line BL connected to it is held at the precharge level of 1.0 V.

Next, the switch SW14 is turned off to release the sense amplifier SA from the reset state and to activate it, and the switch SW13 on the bit line BL is turned on to connect the bit line BL to the sense amplifier SA. The power source voltage Vcc is fed to the P-MOS side of the sense amplifier SA, and the ground potential (0 V) is fed to the N-MOS side. Then, the sense amplifier SA amplifies the potential difference between the bit lines BL and BL* sufficiently, and the switch SW13 on the bit line BL is turned off. As a result, the sense amplifier SA comes into the state that it amplifies the level difference between the bit lines on the select and unselect sides and holds the data.

Figure 21:
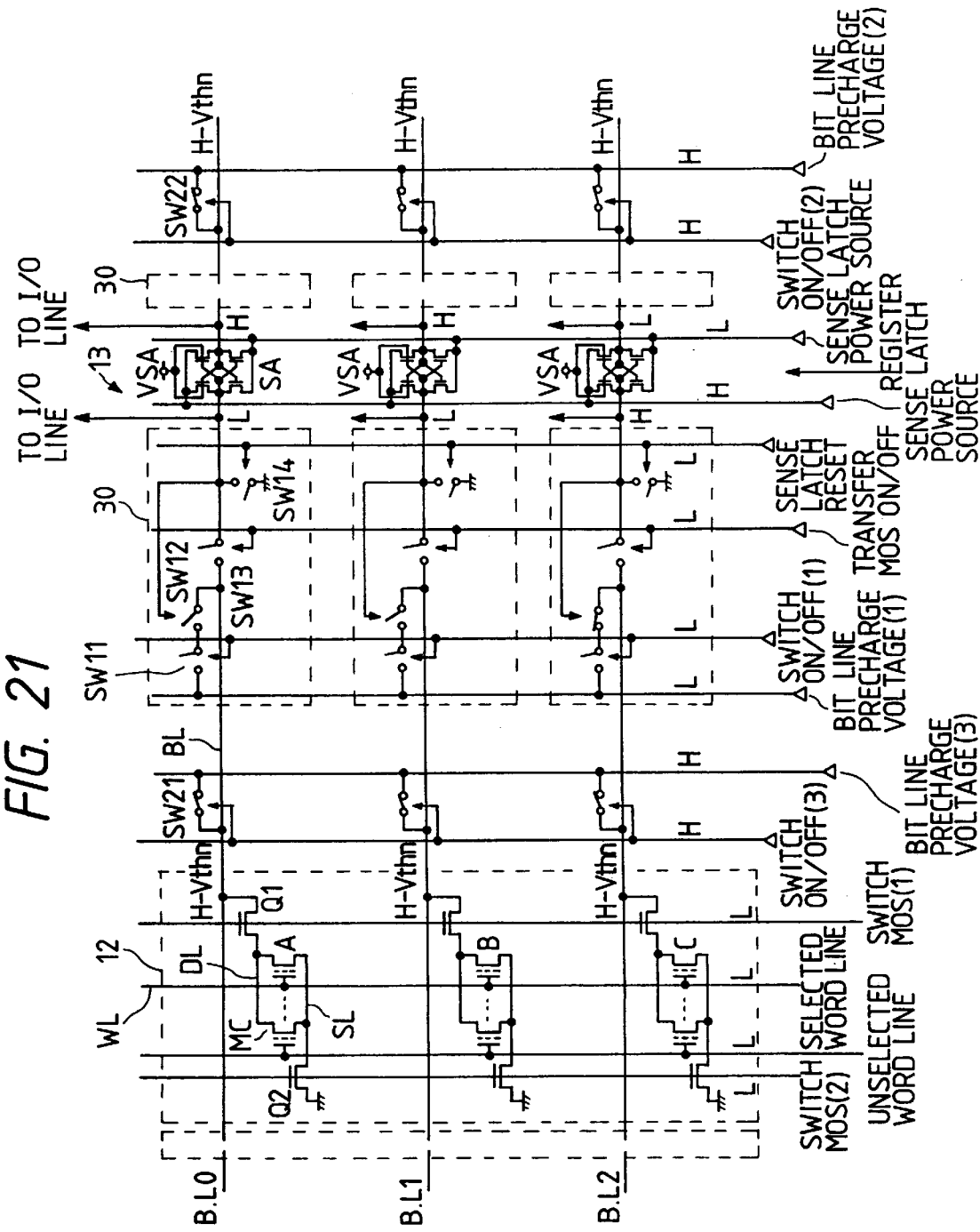
FIG. 21 is a schematic circuit diagram showing the state at the data inversion starting time and the operation of the sense latch circuit.

When the latch data of the sense amplifier SA are to be inverted, the switch SW13 is turned off. With the bit line BL and the sense amplifier SA disconnected from each other, as shown in FIG. 21, the switches SW21 and SW22 are turned on to precharge the bit lines BL on the select and unselect sides to the level of Vcc−Vtn (e.g., 3.3 V−0.6 V=2.7 V). After this, the switches SW21 and SW22 are turned off, and the switch SW11 is turned on. In accordance with the data latched in the sense amplifier SA, the switch SW12 is then turned on if the data are "1s", so that the bit line BL is discharged to the bit line inverting level (0 V). If the data latched in the sense amplifier SA are "0s", on the other hand, the switch SW12 is turned off, so that the bit line BL retains the level Vcc. In short, the inverse level of the latched data of the sense amplifier SA appears in the corresponding bit line BL.

Figure 22:
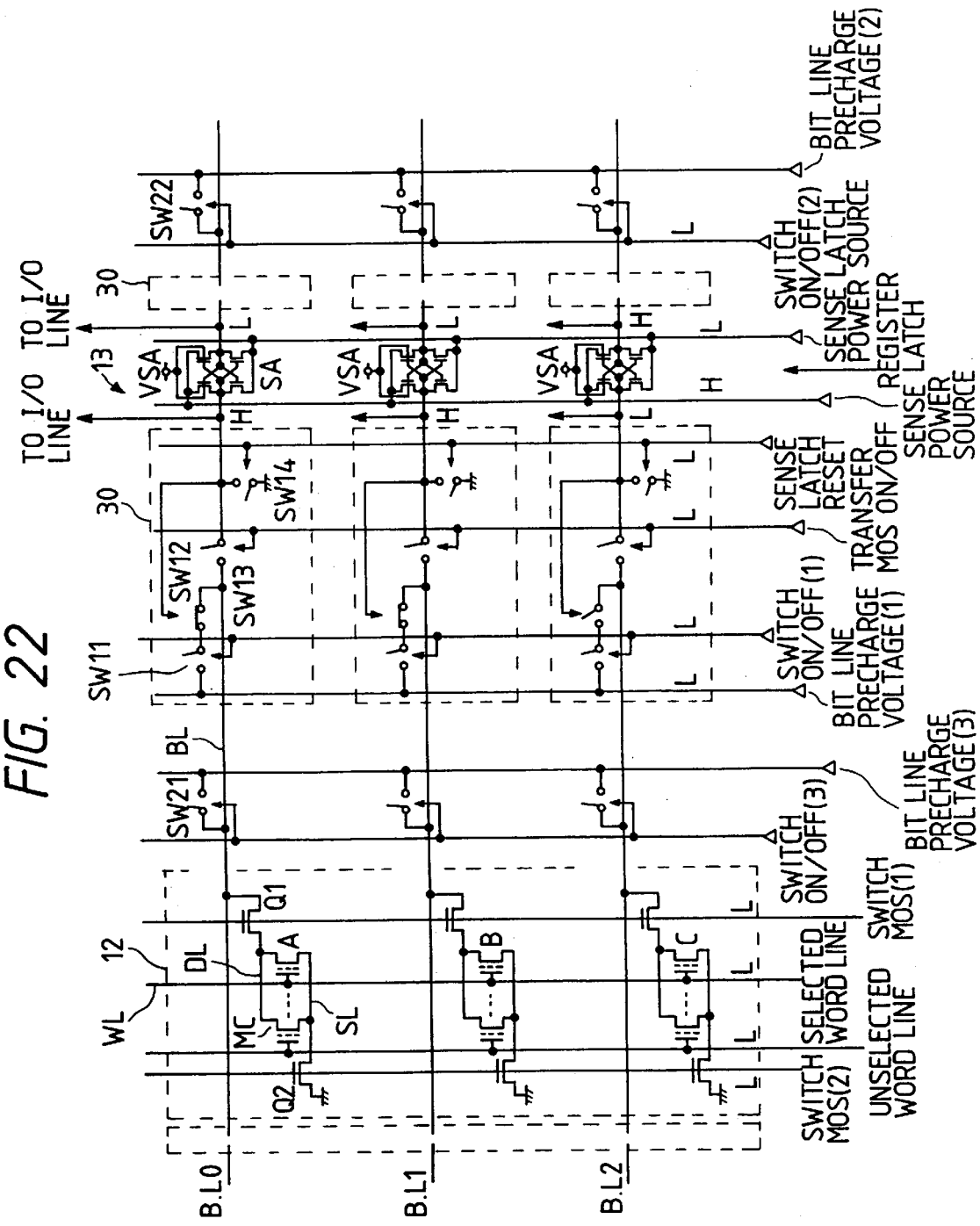
FIG. 22 is a schematic circuit diagram showing the state at the data inversion ending time and the operation of the sense latch circuit.

Here, the switch SW14 is first turned on to reset the sense amplifier SA. After this, the switch SW14 is turned off, and the switch SW13 to the bit line BL is turned on to connect the bit line BL to the sense amplifier SA. In the meantime, the supply voltages on the P-MOS side and the N-MOS side of the sense amplifier SA are set to 0.5 V. Then, the supply voltage Vcc is fed to the P-MOS side of the sense amplifier SA whereas the ground potential (0 V) is fed to the N-MOS side, and the switch SW13 on the bit line BL is turned off. As a result, the sense amplifier SA takes the state that it latches the data corresponding to the level of the bit line in the aforementioned data latching state, as shown in FIG. 22.

In other words, the sense amplifiers corresponding to the cells A and B of FIG. 17 latch the high level "1", and the sense amplifier corresponding to-the cell C latches the low level "0". These operations are similar to the so-called "program verifying" operation. Hence, the bit line precharge has to be executed only for the portion in which the sense latch is "H". By turning on the switch SW11 to set the bit line precharge voltage (1) to 1 V, therefore, only bit lines BL0 and BL1 take the value of 1 V (the bit line BL2 is reset in advance to 0 V).

Next, the switches SW21 and SW22 are turned on while the switch SW13 on the bit line BL is left off, to charge the select side bit line BL to the precharge level of 1.0 V and the unselected-side bit line to the level of 0.5 V. After this, a verify voltage such as 3.5 V slightly lower than the preceding read level (3.7 V) is applied to the selected word line. Then, the memory cell (e.g., the cell A of FIG. 17) having a lower threshold-value than the word line selection level is turned on, so that the bit line BL connected thereto is discharged to the level such as 0.2 V.

Figure 23:
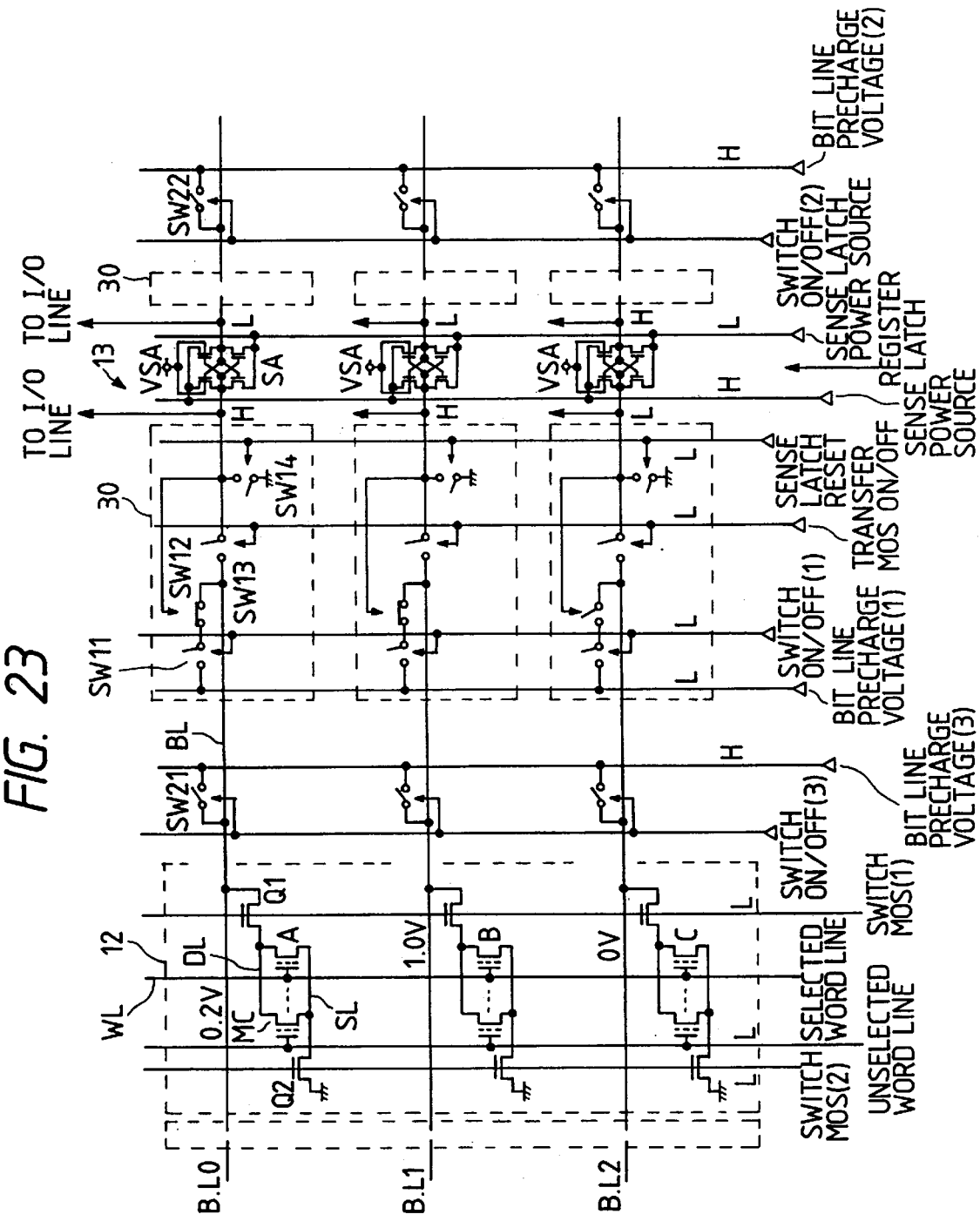
FIG. 23 is a schematic circuit diagram showing the state at the verifying time and the operation of the sense latch circuit.

On the other hand, the memory cell (e.g., the cell B of FIG. 17) having a higher threshold value than the word line selection level is turned off, so that the bit line BL connected thereto retains the precharge level of 1 V. At this time, moreover, since the bit line, which is connected to the memory cell (e.g., the cell C of FIG. 17) corresponding the data "11" having the highest threshold value, intrinsically retains the low level, i.e., "0", it takes the low level even if it is off when the word line is set to the select level (FIG. 23).

As a result, after the sense latch is reset in this state, the switch SW13 on the bit line BL is turned on. Then, the sense amplifier corresponding to the bit line, which is connected to the memory cell (e.g., the cell C of FIG. 17) corresponding to the data "11", and the sense amplifier corresponding to the bit line, which is connected to the memory cell (e.g., the cell A of FIG. 17) having a lower threshold valve than the word line select level, retain the low level "0", whereas the sense amplifier corresponding to the bit line, which is connected to-the memory cell (e.g., the cell B of FIG. 17) having a higher threshold value than the word line select level, retains the high level "1". In the present embodiment, this data retained by the sense amplifier are used to make a shift to the programming operation to apply the program pulse (−10 V) to the selected word line, thereby lowering the threshold value of the memory cell corresponding to the retained data "1" of the sense amplifier.

After the application of the program pulse, the reading operation is executed by setting the word line again to the selection level. Then, the bit line of the memory cell having a lower threshold value than the word line verify level is changed to the low level, i.e., "0", and the bit line connected to the insufficiently programmed memory cell retains the high level "1". By latching this state by the sense amplifier to execute the programming operation again, only the threshold value of the memory cell, in which the latched data of the sense latch corresponds to "1", is lowered to sharpen the threshold value distribution shape. The data latched by the sense amplifier A are fed to the aforementioned all decision circuit 20 through both so-called column switch turned on/off by the output signal of the Y-decoder 15 and the common I/O line, and it is judged whether or not they are all "0". If they are all "0", the refresh for the memory cells of the data "10" are ended, and the refresh for the memory cells of the data "01" and "00" is executed.

Incidentally, the re-programming operation of the insufficiently programmed memory cell in the aforementioned program mode is identical to the aforementioned one effected by the sense latch circuit 13 at the refreshing time.

In the foregoing embodiment, as has been described hereinbefore, at the data programming time, data of a plurality of bits are transformed by a data transforming logic circuit into data (multi-value data) according to the combination of the bits, and the transformed data are sequentially transferred to a latch circuit connected to the bit lines of a memory array. A program pulse is generated according to the data latched in the latch circuit and is applied to a memory element in a selected state, so that a threshold value is made to correspond to the multi-value data. In the data reading operation, the states of the memory elements are read out by changing the read voltage to intermediate values of the individual threshold values and are transferred to and latched in a register for storing the multi-value data, so that the original data may be restored by a data inverse transforming logic circuit on the basis of the multi-value data stored in the register. As a result, the following effects can be achieved. The peripheral circuit scale of the memory array can be suppressed to a relatively small size. In the programming operation, the verify voltage value of the word line is sequentially changed by a predetermined value in a direction away from the near side of the erasing word line voltage so that the total number of the program pulses, i.e., the program time period can be reduced compared to the multi-value flash memory system, in which the verify voltage is set at random, thereby to realize a programming operation performed in a short time.

Moreover, after a weak erasing operation of the memory elements in the memory array is executed, the memory element, which has a threshold value lower than the read level of the word line and higher than the verify level, is detected, and the program is executed so that the threshold value of the memory element may be lower than the verify voltage, thereby narrowing the width of the variation distribution shape of the threshold voltage of the memory element which is programmed according to the individual input data. As a result, the following effect can be achieved. The variation distribution shape of the threshold voltage of the memory elements, which has been widened due to the disturb or the retention influences, can be returned to the steep shape substantially identical to that just after the end of the programming operation.

Although our invention has been specifically described in connection with its embodiments, it should not be limited to the embodiments specifically described but can naturally be modified in various manners without departing from the gist thereof. In the foregoing embodiments, for example, the quaternary data are stored by setting the threshold value of one memory cell at four stages, but these threshold values can be set to three stages or five or more stages.

In the embodiments, on the other hand, the inversion of the read data at the refreshing time and the narrowing of the memory cells, in which the read data are to be programmed, can be effected by using only the sense latch circuit. Despite this construction, however, there may be provided a register for latching the read data and a logic circuit for narrowing the memory cell to be programmed, by performing a logic operation, e.g., by inverting the content of the register.

In the embodiments, moreover, the three kinds of operations, as shown in FIG. 1(2) . . . are executed as a transformation of the two-bits data into the quaternary data and vice versa. However, the logic operation should not be limited to those of FIG. 1 but may be any logic operation as long as data having different numbers of bits of "1" can be resultantly obtained. Furthermore, the operation for data inverse transformation should not be limited to those of FIG. 2 but may be any operation as long as the original two-bits data can be restored, and the number of operations should not be limited to one but may be two or more.

The programming method for each memory cell should not be limited to that of the embodiment in which the threshold value is lowered by the program pulse after it has been first raised for the erasure, but may be the one in which the threshold value is raised by the program pulse. In the embodiment, moreover, the threshold value is changed by programming the memory cell corresponding to the sense latch latching the data "1". However, the threshold value may be changed by programming the memory cell which corresponds to the sense latch latching the data "0".

The description thus far made is directed mainly to a batch-erase type flash memory to which our invention is applied and which is the field of application of its background. However, the present invention should not be limited thereto but can be applied generally to a nonvolatile memory device having FAMOSs as its memory elements and further widely to a semiconductor memory device which is equipped with memory cells having a plurality of threshold values.

According to the present invention, as has been described hereinbefore, it is possible to realize a multi-value type nonvolatile memory device which can carry out programming, reading and erasing operations of high accuracy which are performed in a short time period while minimizing the increase in the circuit scale, and a nonvolatile memory device capable of sharpening the shape of the variation distribution of while threshold values of memory elements and stably operating at a low voltage.

We claim:

1. A nonvolatile memory device in which data of two bits or more are stored in one memory cell by setting a threshold value of said memory cell to three or more stages and by changing a level of a word line to two or more stages to read said memory cell, comprising:

a binary data register latching program data which includes a plurality of bits;

a data transforming logic circuit executing a predetermined operation for the plurality of bits in the program data to transform the program data into multi-value data according to a combination in binary data represented by the plurality of bits;

an inverse transforming logic circuit for transforming the multi-value data read out from said memory cell into the binary data represented by the plurality of bits;

a memory array including a plurality of memory cells;

a selection circuit selecting a memory cell from the memory array;

a control circuit sequentially changing a program voltage to be supplied to the selected memory cell to program said multi-value data in the selected memory in a memory array; and a circuit coupled to the word line and sequentially changing a voltage to be supplied to the word line in a program verifying operation in which a threshold voltage is verified and in a reading operation in which data is read out from the memory cell, in a direction apart from the voltage which is set to the word line in an erasure operation in which a threshold voltage of the memory cell is changed to a predetermined value.

2. A nonvolatile memory device in which data of two bits or more are stored in one memory cell by setting a threshold value of said memory cell to three or more stages and by changing a level of a word line to two or more stages to read said memory cell, comprising:

a binary data register latching program data which includes a plurality of bits;

a data transforming logic circuit executing a predetermined operation for the plurality of bits in the program data to transform the program data into multi-value data according to a combination in binary data represented by the plurality of bits;

an inverse transforming logic circuit for transforming the multi-value data read out from said memory cell into the binary data represented by the plurality of bits; and a circuit coupled to the word line and sequentially changing a voltage to be supplied to the word line in a program verifying operation in which a threshold voltage is verified and in a reading operation in which data is read out from the memory cell, in a direction apart from the voltage which is set to the word line in an erasure operation in which a threshold voltage of the memory cell is changed to a predetermined value.

3. A semiconductor memory device comprising:

a memory array including a plurality of electrically programmable and erasable memory cells each of which stores one of three memory state "0", "1", and "2" each of which is represented by a threshold voltage in three threshold voltages; and a writing circuit executing a write operation to said memory cell to change the memory state of said memory cell, wherein, the threshold voltage corresponding to the memory state "1" has a value between the threshold voltage corresponding to the memory state "0" and that corresponding to the memory state "2", and when changing the memory state of said memory cell to "2", said writing circuit executes the write operation to said memory cell to change the memory state to "1", then the write operation to said memory cell to change the memory state from "1" to "2".

4. A semiconductor memory device according to claim 3, wherein, when storing information in memory cells whose memory state is "0", said writing circuit executes the write operation for ones of the memory cells to change the memory of said ones to "1", then executes the write operation for ones of the memory cells whose memory state has been changed to "1" to change the memory state to "2".

5. A semiconductor memory device comprising:
a memory array including a plurality of electrically programmable and erasable memory cells each of which stores one of three memory state "0", "1", and "2" each of which is represented by a threshold voltage in three threshold voltages; and
a writing circuit that writes data to said memory cells to change the memory state of said memory cells,
wherein, the threshold voltage corresponding to the memory state "1" has a value between the threshold voltage corresponding to the memory state "0" and that corresponding to the memory state "2", and
when storing information into memory cells whose memory state is "0", said writing circuit executes a write operation for ones of the memory cells whose memory state is "0" to change the memory state into "1", then executes a write operation for ones of the memory cells whose memory state is "0" to change the memory state into "2".

6. A semiconductor memory device comprising:
a memory array including a plurality of electrically programmable and erasable memory cells each of which stores one of three memory state "0", "1", and "2" each of which is represented by a threshold voltage in three threshold voltages; and
a writing circuit executing a write operation for said memory cell to change the memory state of said memory cell,
wherein, the threshold voltage corresponding to the memory state "1" has a value between the threshold voltage corresponding to the memory state "0" and that corresponding to the memory state "2", and
if the memory array includes memory cells having the memory state "0", memory cells having the memory state "1" and memory cells having the memory state "2" by storing information into memory cells whose memory state is "0", said writing circuit executes the write operation at least twice.

7. A semiconductor memory device according to claim 6, wherein a verification operation in which the threshold voltage is verified is performed at least once between said two writer operations.

8. A semiconductor memory device comprising:
a memory array including a plurality of electrically programmable and erasable memory cells each of which stores one of three memory state "0", "1", and "2" each of which is represented by a threshold voltage in three threshold voltages; and a writing circuit executing a write operation for said memory cell to change the memory state of said memory cell,
wherein, the threshold voltage corresponding to the memory state "1" has a value between the threshold voltage corresponding to "0" and that corresponding to "2", and if the memory array includes memory cells having the memory state "0", memory cells having the memory state "1" and memory cells having the memory state "2" by storing information into memory cells whose memory state is "0", said writing circuit executes a first writing operation that changes state "0" into "1" and a second writing operation that changes state "1" into "2" in this order.

9. A semiconductor memory device according to claim 8, wherein a first verification in which the threshold voltage is verified is performed is performed between said first and second writing operations and a second verification in which the threshold voltage is verified is performed is performed after said second writing operation.

10. A semiconductor memory device according to claim 9, wherein a threshold voltage used to detect the threshold voltage of the memory cell differs between said first verification and said second verification.

11. A semiconductor memory device comprising:
a memory array including a plurality of memory cells each of which stores one of at least three memory states each of which is represented by a threshold voltage in at least three threshold voltages; and
a data circuit that holds data corresponding to said memory states in said memory cells,
a writing circuit that writes data to said memory cells according to contents of said data circuits,
wherein, said writing circuit verifies a memory cell using a verification voltage when changing the memory cell to a first threshold voltage, and verifies a memory cell using multiple verification voltages when changing the memory cell to a second threshold voltage.

12. A semiconductor memory device comprising:
a memory array including a plurality of electrically programmable and erasable memory cells each of which stores one of three memory states "0", "1", and "2" each of which is represented by a threshold voltage in three threshold voltages; and
a writing circuit executing a write operation for said memory cell to change the memory state of said memory cell, wherein, the threshold voltage corresponding to the memory state "1" has a value between the threshold voltage corresponding to "0" and that corresponding to "2", and
if the memory array includes memory cells having the memory state "0", memory cells having the memory state "1" and memory cells having the memory state "2" by storing information into memory cells whose memory state is "0", said writing circuit executes a first verification to check whether a memory cell is in state "1" and a second verification to check whether a memory cell is in state "2" in that order.

13. An access method for a semiconductor memory device comprising a memory array including a plurality of electrically programmable and erasable memory cells each of which stores one of three memory state "0", "1", and "2" each of which is represented by a threshold voltage in three threshold voltages, wherein, the threshold voltage corresponding to "1" has a value between the threshold voltage corresponding to "0" and that corresponding to "2", comprising the steps of:
executing a first verification to check whether a memory cell is in state "1" and a second verification to check whether a memory cell is in state "2", if the memory array includes memory cells having the memory state "0", memory cells having the memory state "2" and memory cells having the memory state "2" by storing information into memory cells whose memory state is "0", and executing a first reading operation to read state "1" and a second reading operation to read state "2", if the memory state "1" and memory cells having the memory state "2" by storing information into memory cells whose memory state is "0", wherein a first voltage is used for said first reading operation, a second voltage is used for said first verification, a third voltage is used for said second reading operation, and a fourth voltage is used for said second verification, said first to fourth voltages are specified in ascending order or descending order (FIGS. 6 and 9).

14. A nonvolatile memory device in which two or more bits of data is stored in each memory cell whose threshold voltage is set to two or more levels and whose contents is read by changing the word line level to two or more levels, comprising:

a first binary data register that holds the input write data;

a data conversion logic circuit that performs a specified calculation between the bits of input data to convert the data into multiple-value data according to the combination of the bits;

a second binary data register that holds the data read from said memory cells;

a restore circuit that converts the multiple-value data stored in said memory cells into binary data;

a memory array including a plurality of memory cells;

a selection circuit selecting a memory cell from the memory array;

a control circuit sequentially changing a program voltage to be supplied to the selected memory cell to program said multi-value data in the selected memory in a memory array; and a circuit coupled to the word line and sequentially changing a voltage to be supplied to the word line in a program verifying operation in which a threshold voltage is verified and in a reading operation in which data is read out from the memory cell, in a direction apart from the voltage which is set to the word line in an erasure operation in which a threshold voltage of the memory cell is changed to a predetermined value.

15. A nonvolatile memory device in which two or more bits of data is stored in each memory cell whose threshold voltage is set to two or more levels and whose contents is read by changing the word line level to two or more levels, comprising:

a first binary data register that holds the input write data;

a data conversion logic circuit that performs a specified calculation between the bits of input data to convert the data into multiple-value data according to the combination of the bits;

a second binary data register that holds the data read from said memory cells;

a restore circuit that converts the multiple-value data stored in said memory cells into binary data; and a circuit coupled to the word line and sequentially changing a voltage to be supplied to the word line in a program verifying operation in which a threshold voltage is verified and in a reading operation in which data is read out from the memory cell, in a direction apart from the voltage which is set to the word line in an erasure operation in which a threshold voltage of the memory cell is changed to a predetermined value.

16. A multi-value nonvolatile semiconductor memory device comprising:

a plurality of memory cells each of which has a threshold voltage corresponding to data of at least two bits, and threshold voltages of which are distributed as at least three threshold distributions indicating mutually different programming states and a threshold distribution indicating an erase state different from said programming states; and a controller which controls to set each threshold voltage of ones of said plurality of memory cells, wherein said controller carries out a setting operation to set each threshold voltage of ones of said plurality of memory cells in accordance with data to be stored in each said plurality of memory cells, and wherein said setting operation carried out by said controller includes:

a first step setting each threshold voltage of ones of said plurality of memory cells so as to allocate each threshold voltage in a threshold distribution which corresponds to one of said at least three threshold distributions corresponding to said programming states set from said threshold distribution corresponding to said erase state in accordance with said data to be stored in each one of said plurality of memory cells, and a second step varying threshold distributions of said plurality of memory cells each of which has a threshold voltage set by said first step.

17. A multi-value nonvolatile semiconductor memory device according to claim 16, further comprising:

a plurality of word lines each of which is coupled to the corresponding memory cells of said plurality of memory cells.

18. A multi-value nonvolatile semiconductor memory device according to claim 17, further comprising:

a plurality of terminals receiving an address signal for selecting a word line from said plurality of word lines, wherein said plurality of terminals receives a command for setting each threshold voltage of ones of said plurality of memory cells to one of said at least three threshold distributions.

19. A multi-value nonvolatile semiconductor memory device according to claim 18, wherein said second step varies said threshold distributions of said plurality of memory cells each of which has a threshold voltage set by said first step in accordance with said data to be stored in each one of said plurality of memory cells.

20. A multi-value nonvolatile semiconductor memory device according to claim 19, wherein each of said plurality of memory cells has a floating gate, each threshold voltage of said plurality of memory cells is set by electrically programming electrons to said floating gate.

21. A multi-value nonvolatile semiconductor memory device according to claim 16, wherein said threshold voltages of memory cells allocated in said at least three threshold distributions are moved to said threshold distribution corresponding to said erase state by executing an erase command.

22. A multi-value nonvolatile semiconductor memory device comprising:

a plurality of memory cells each of which has a threshold voltage corresponding to data of at least two bits, wherein threshold voltages of ones of said plurality of memory cells are shifted to at least three threshold distributions indicating mutually different programming states from a threshold distribution indicating an erase state different from said programming states; and a controller which controls to set each threshold voltage of ones of said plurality of memory cells, wherein said controller carries out a setting operation to set each threshold voltage of ones of said plurality of memory cells in accordance with data to be stored in each of said plurality of memory cells and a verify operation for verifying whether threshold voltages of ones of said plurality of memory cells are set to a threshold voltage corresponding to data to be stored in each of said plurality of memory cells, and wherein said setting operation carried out by said controller includes:

a first step setting each threshold voltage of ones of said plurality of memory cells so as to allocate each threshold voltage in a threshold distribution which corresponds to one of said at least three threshold distributions corresponding to said programming states shifted from said threshold distribution corresponding to said erase state in accordance with said data to be stored in each one of said plurality of memory cells, and a second step varying threshold distributions of said plurality of memory cells each of which has a threshold voltage set by said first step after the setting of threshold voltages of ones of said plurality of memory cells by said first step are verified by said verify operation of said controller.

23. A multi-value nonvolatile semiconductor memory device according to claim 22, further comprising:

a plurality of word lines each of which is coupled to the corresponding memory cells of said plurality of memory cells.

24. A multi-value nonvolatile semiconductor memory device according to claim 23, further comprising:

a plurality of terminals receiving an address signal for selecting a word line from said plurality of word lines, wherein said plurality of terminals receives a command for setting each threshold voltage of ones of said plurality of memory cells to one of said at least three threshold distributions.

25. A multi-value nonvolatile semiconductor memory device according to claim 24, further comprising:

a voltage generation circuit which generates three or more verify voltages for verifying whether or not each threshold voltage of said ones of said plurality of memory cells is shifted to said at least three threshold distributions, wherein values of said at least three verify voltages are different from each other.

26. A multi-value nonvolatile semiconductor memory device according to claim 25, wherein said second step varies said threshold distributions of said plurality of memory cells each of which has a threshold voltage set by said first step in accordance with said data to be stored in each one of said plurality of memory cells.

27. A multi-value nonvolatile semiconductor memory device according to claim 26, wherein each of said plurality of memory cells has a floating gate, each threshold voltage of said plurality of memory cells is set by electrically programming electrons to said floating gate.

28. A multi-value nonvolatile semiconductor memory device according to claim 22, wherein said threshold voltages of memory cells allocated in said at least three threshold distributions are moved to said threshold distribution indicating said erase state by executing an erase command.

29. A multi-value nonvolatile semiconductor memory device comprising:

a plurality of memory cells each of which has a threshold voltage corresponding to data of at least two bits and threshold voltages of which are distributed as at least three threshold distributions indicating mutually different programming states and a threshold distribution indicating an erase state different from said programming states; and a controller which controls to set each threshold voltage of ones of said plurality of memory cells, wherein said controller carries out a setting operation to set each threshold voltage of ones of said plurality of memory cells in accordance with data to be stored in each of said plurality of memory cells, and wherein said setting operation carried out by said controller includes:

a first step setting each threshold voltage of ones of said plurality of memory cells so as to allocate each threshold voltage in a threshold distribution which corresponds to one of said at least three threshold distributions corresponding to said programming states set from said threshold distribution corresponding to said erase state in accordance with said data to be stored in each one of said plurality of memory cells, wherein with respect to said first step ones of said plurality of memory cells are programmed in parallel to each corresponding one of said at least three threshold distributions corresponding to said programming states from said threshold distribution corresponding to said erase state in accordance with said data to be stored in each of said plurality of memory cells, and a second step varying threshold distributions of said plurality of memory cells each of which has a threshold voltage set by said first step.

30. A multi-value nonvolatile semiconductor memory device according to claim 29, further comprising:

a plurality of word lines each of which is coupled to the corresponding memory cells of said plurality of memory cells.

31. A multi-value nonvolatile semiconductor memory device according to claim 30, further comprising:

a plurality of terminals receiving an address signal for selecting a word line from said plurality of word lines, wherein said plurality of terminals receives a command for setting each threshold voltage of ones of said plurality of memory cells to one of said at least three threshold distributions.

32. A multi-value nonvolatile semiconductor memory device according to claim 31, wherein said second step varies said threshold distributions of said plurality of memory cells, each of which has a threshold voltage set by said first step in accordance with said data to be stored in each one of said plurality of memory cells.

33. A multi-value nonvolatile semiconductor memory device according to claim 32, wherein each of said plurality of memory cells has a floating gate, each threshold voltage of said plurality of memory cells is set by electrically programming electrons to said floating gate.

34. A multi-value nonvolatile semiconductor memory device according to claim 29, wherein said threshold voltages of memory cells allocated in said at least three threshold distributions are moved to said threshold distribution indicating said erase state by executing an erase command.

35. A multi-value nonvolatile semiconductor memory device comprising:

a plurality of memory cells each of which has a threshold voltage corresponding to data of at least two bits, wherein threshold voltages of ones of said plurality of memory cells are shifted to at least three threshold distributions indicating mutually different programming states from a threshold distribution indicating an erase state different from said programming states; and a controller which controls to set each threshold voltage of ones of said plurality of memory cells, wherein said controller carries out a setting operation to set each threshold voltage of ones of said plurality of memory cells in accordance with data to be stored in each one of said plurality of memory cells and a verify operation for verifying whether or not threshold voltages of ones of said plurality of memory cells are set to a threshold voltage corresponding to data to be stored in each of said plurality of memory cells, and wherein said setting operation carried out by said controller includes:

a first step setting each threshold voltage of ones of said plurality of memory cells so as to allocate each threshold voltage in a threshold distribution which corresponds to one of said at least three threshold distributions corresponding to said programming states shifted from said threshold distribution corresponding to said erase state in accordance with said data to be stored in each one of said plurality of memory cells, wherein with respect to said first step ones of said plurality of memory cells are programmed in parallel to each corresponding one of said at least three threshold distributions corresponding to said programming states from said threshold distribution corresponding to said erase state in accordance with said data to be stored in each one of said plurality of memory cells, and a second step varying threshold distributions of said plurality of memory cells each of which has a threshold voltage set by said first step after the setting of threshold voltages of ones of said plurality of memory cells by said first step are verified by said verify operation of said controller.

36. A multi-value nonvolatile semiconductor memory device according to claim 35, further comprising:

a plurality of word lines each of which is coupled to the corresponding memory cells of said plurality of memory cells.

37. A multi-value nonvolatile semiconductor memory device according to claim 36, further comprising:

a plurality of terminals receiving an address signal for selecting a word line from said plurality of word lines, wherein said plurality of terminals receives a command for setting each threshold voltage of ones of said plurality of memory cells to one of said at least three threshold distributions.

38. A multi-value nonvolatile semiconductor memory device according to claim 37, further comprising:

a voltage generation circuit which generates a first, second and third verify voltages, said first verify voltage for verifying whether threshold voltages of said second memory cells are shifted to said second threshold distribution, said second verify voltage for verifying whether said third memory cells are shifted to said third threshold distribution, said third verify voltage for verifying whether said fourth memory cells are shifted to said fourth threshold distribution, wherein values said first, said second and said third verify voltages are different from each other.

39. A multi-value nonvolatile semiconductor memory device according to claim 38, wherein said second step varies said threshold distributions of said plurality of memory cells each of which has a threshold voltage set by said first step in accordance with said data to be stored in each one of said plurality of memory cells.

40. A multi-value nonvolatile semiconductor memory device according to claim 39, wherein each of said plurality of memory cells has a floating gate, each threshold voltage of said plurality of memory cells is set by electrically programming electrons to said floating gate.

41. A multi-value nonvolatile semiconductor memory device according to claim 35, wherein said threshold voltages of memory cells allocated in said at least three threshold distributions are moved to said threshold distribution indicating said erase state by executing an erase command.

42. A nonvolatile semiconductor memory device comprising:

a plurality of nonvolatile memory cells each of which has a threshold voltage corresponding to data of at least two bits, wherein threshold voltages of ones of said plurality of nonvolatile memory cells are moved to at least three threshold ranges indicating mutually different programming states from a threshold range indicating an erase state different from said programming states; and a controller which controls to set each threshold voltage of ones of said plurality of nonvolatile memory cells, wherein said controller carries out a setting operation to set each threshold voltage of ones of said plurality of nonvolatile memory cells in accordance with data to be stored in each one of said plurality of nonvolatile memory cells and a verify operation for verifying whether threshold voltages of ones of said plurality of nonvolatile memory cells are set to a threshold range corresponding to data to be stored in each one of said plurality of memory cells, and wherein said setting operation carried out by said controller includes:

a first step setting each threshold voltage of ones of said plurality of nonvolatile memory cells so as to allocate each threshold voltage in a threshold range which corresponds to one of said at least three threshold ranges corresponding to said programming states in accordance with said data to be stored in each one of said plurality of nonvolatile memory cells, wherein each of said memory cells have been set to said threshold voltages corresponding to said erase state prior to said first step, and a second step modifying threshold voltages of at least necessary ones of said plurality of nonvolatile memory cells each of which has a threshold voltage set by said first step after the setting of threshold voltages of ones of said plurality of memory cells by said first step are verified by said verify operation of said controller.

43. A nonvolatile semiconductor memory device according to claim 42, further comprising:

a plurality of word lines each of which is coupled to the corresponding memory cells of said plurality of memory cells.

44. A nonvolatile semiconductor memory device according to claim 43, further comprising:
   a plurality of terminals receiving an address signal for selecting a word line from said plurality of word lines,
   wherein said plurality of terminals receives a command for setting each threshold voltage of ones of said plurality of nonvolatile memory cells to one of said at least three threshold ranges.

45. A nonvolatile semiconductor memory device according to claim 44, further comprising:
   a voltage generation circuit which generates three or more verify voltages for verifying whether or not each threshold voltage of said ones of said plurality of memory cells is shifted to said at least three threshold ranges, wherein values of said at least three verify voltages are different from each other.

46. A nonvolatile semiconductor memory device according to claim 45, wherein said second step modifies said threshold voltages at least necessary ones of said plurality of nonvolatile memory cells each of which has a threshold voltage set by said first step in accordance with said data to be stored in each one of said plurality of nonvolatile memory cells.

47. A nonvolatile semiconductor memory device according to claim 46, wherein each of said plurality of nonvolatile memory cells has a floating gate, each threshold voltage of said plurality of nonvolatile memory cells is set by electrically programming electrons to said floating gate.

48. A nonvolatile semiconductor memory device according to claim 42, wherein said threshold voltages of nonvolatile memory cells allocated in said at least three threshold ranges are moved to said threshold range indicating said erase state by executing an erase command.

49. A nonvolatile semiconductor memory device comprising:
   a plurality of nonvolatile memory cells each of which has a threshold voltage corresponding to data of at least two bits, and threshold voltages of which are allocated as at least three threshold ranges indicating mutually different programming states and a threshold range indicating an erase state different from said programming states; and
   a controller which controls to set each threshold voltage of ones of said plurality of nonvolatile memory cells,
   wherein said controller carries out a setting operation to set each threshold voltage of ones of said plurality of nonvolatile memory cells in accordance with data to be stored in each one of said plurality of nonvolatile memory cells, and
   wherein said setting operation carried out by said controller includes:
      a first step setting each threshold voltage of ones of said plurality of nonvolatile memory cells so as to allocate each threshold voltage in a threshold range which corresponds to one of said at least three threshold ranges indicating said programming states in accordance with said data to be stored in each one of said plurality of nonvolatile memory cells by said first step ones of said plurality of memory cells being programmed in parallel to each corresponding one of said at least three threshold ranges corresponding to said programming states from said threshold range corresponding to said erase state in accordance with said data to be stored in each one of said plurality of memory cells, and
      a second step modifying threshold voltages of at least necessary ones of said plurality of nonvolatile memory cells each of which has a threshold voltage set by said first step.

50. A nonvolatile semiconductor memory device according to claim 49, further comprising:
   a plurality of word lines each of which is coupled to the corresponding memory cells of said plurality of nonvolatile memory cells.

51. A nonvolatile semiconductor memory device according to claim 50, further comprising:
   a plurality of terminals receiving an address signal selecting a word line from said plurality of word lines,
   wherein said plurality of terminals receives a command for setting each threshold voltage of ones of said plurality of nonvolatile memory cells to one of said at least three threshold ranges.

52. A nonvolatile semiconductor memory device according to claim 51, wherein said second step modifies said threshold voltages at least necessary ones of said plurality of nonvolatile memory cells each of which has a threshold voltage set by said first step in accordance with said data to be stored in each one of said plurality of nonvolatile memory cells.

53. A nonvolatile semiconductor memory device according to claim 52, wherein each of said plurality of nonvolatile memory cells has a floating gate, each threshold voltage of said plurality of nonvolatile memory cells is set by electrically programming electrons to said floating gate.

54. A nonvolatile semiconductor memory device according to claim 49, wherein said threshold voltages of nonvolatile memory cells allocated in said at least three threshold ranges are moved to said threshold range indicating said erase state by executing an erase command.

55. A nonvolatile semiconductor memory device comprising:
   a plurality of nonvolatile memory cells each of which has a threshold voltage corresponding to data of at least two bits, wherein threshold voltages of ones of said plurality of nonvolatile memory cells are moved to at least three threshold ranges indicating mutually different programming states from a threshold range indicating an erase state different from said programming states; and
   a controller which controls to set each threshold voltage of ones of said plurality of nonvolatile memory cells,
   wherein said controller carries out a setting operation to set each threshold voltage of ones of said plurality of nonvolatile memory cells in accordance with data to be stored in each one of said plurality of nonvolatile memory cells and a verify operation for verifying whether or not threshold voltages of ones of said plurality of nonvolatile memory cells are set to a threshold voltage corresponding to data to be stored in each one of said plurality of nonvolatile memory cells, and
   wherein said setting operation carried out by said controller includes:
      a first step setting each threshold voltage of ones of said plurality of nonvolatile memory cells so as to allocate each threshold voltage in a threshold range which corresponds to one of said at least three threshold ranges corresponding to said programming states in accordance with said data to be stored in each one of said plurality of nonvolatile memory cells by said first step ones of said plurality of memory cells being programmed in parallel to each corresponding one of said at least three ranges corresponding to said programming states from said threshold range corresponding to said erase state in accordance with said data to be scored in each one of said plurality of memory cells, and a second step modifying threshold voltages of at least necessary ones of said plurality of nonvolatile memory cells each of which has a threshold voltage set by said first step after the setting of threshold voltages of ones of said plurality of nonvolatile memory cells by said first step are verified by said verify operation of said controller.

56. A nonvolatile semiconductor memory device according to claim 55, further comprising:

a plurality of word lines each of which is coupled to the corresponding memory cells of said plurality of nonvolatile memory cells.

57. A nonvolatile semiconductor memory device according to claim 56, further comprising:

a plurality of terminals receiving an address signal for selecting a word line from said plurality of word lines, wherein said plurality of terminals receives a command for setting each threshold voltage of ones of said plurality of nonvolatile memory cells to one of said at least three threshold ranges.

58. A nonvolatile semiconductor memory device according to claim 57, further comprising:

a voltage generation circuit which generates a first, a second and a third verify voltages, said first verify voltage for verifying whether or not threshold voltages of said second memory cells are shifted to said second threshold range, said second verify voltage for verifying whether or not said third memory cells are moved to said third threshold range, said third verify voltage for verifying whether or not said fourth memory cells are shifted to said fourth threshold range, wherein values said first, said second and said third verify voltages are different from each other.

59. A nonvolatile semiconductor memory device according to claim 58, wherein said second step modifies said threshold voltages of at least necessary ones of said plurality of nonvolatile memory cells each of which has a threshold voltage set by said first step in accordance with said data to be stored in each one of said plurality of nonvolatile memory cells.

60. A nonvolatile semiconductor memory device according to claim 59, wherein each of said plurality of nonvolatile memory cells has a floating gate, each threshold voltage of said plurality of nonvolatile memory cells is set by electrically programming electrons to said floating gate.

61. A nonvolatile semiconductor memory device according to claim 55, wherein said threshold voltages of nonvolatile memory cells allocated in said at least three threshold ranges are moved to said threshold range indicating said erase state by executing an erase command.

62. A semiconductor memory comprising:

a memory array including a plurality of memory cells, each memory cell having a floating gate, and a threshold level of each memory cell depends on a value of electric charge in said floating gate of said memory cell, wherein said threshold level of each memory cell is placed in one of three areas including an erase area, a first storing area, and a second storing area for storing at least three-value information in each of said memory cells, said first storing area being located between said erase area and said second storing area;

an input terminal receiving write information data to be stored in said memory cell array;

a write data conversion circuit coupled to said input terminal, said write data conversion circuit generates a data signal which controls said threshold level of said memory cells; and a write circuit which performs a first write operation and a second write operation, after said first write operation, based on said data signal for storing said write information data, wherein said first write operation applies a plurality of pulses to at least one of said memory cells to shift a threshold level thereof, wherein said second write operation applies a plurality of pulses to said memory cells whose threshold level is shifted by said first write operation, wherein said first write operation includes a first verify operation for verifying whether a threshold level of memory cell is located in a first predetermined area by using a first reference signal, and wherein said second write operation includes a second verify operation for verifying whether a threshold level of memory cell is located in a second predetermined area by using a second reference signal.

63. A semiconductor memory according to claim 62, wherein said semiconductor memory is a non-volatile memory.

64. A semiconductor memory according to claim 62, wherein said second write operation is operated after said threshold level of memory cell is fixed in said first predetermined area by said first write operation.

65. A semiconductor memory according to claim 62, wherein said first reference signal and second reference signal are different signals.

66. A semiconductor memory comprising:

a plurality of memory cells, each memory cell having a floating gate and a threshold level, said threshold level of each memory cell depends on a value of electric charge in said floating gate of each memory cell, wherein said threshold level of each memory cell is placed in one of three areas including an erase area, a first storing area, and a second storing area for storing three value data in each of said memory cells, said first storing area being located between said erase area and said second storing area; and a write circuit which performs a first write operation and a second write operation, after said first write operation, wherein a threshold level of at least one memory cell is located in a predetermined area by said first write operation and said second write operation, wherein said first write operation includes a first prior pulse and a first following pulse, which follows said first prior pulse, and said first prior pulse is applied to all memory cells whose threshold level should be changed to store said data, wherein said second write operation includes a second prior pulse and a second following pulse, which follows said second prior pulse, and said second prior pulse is applied to at least one memory cell whose threshold level should be changed to store said data, wherein said first write operation includes a first read out operation to detect a threshold level of each of said memory cells by using a first reference level, and wherein said second write operation includes a second read out operation to detect a threshold level at least one of said memory cells by using a second reference level.

67. A semiconductor memory according to claim 66, wherein said semiconductor memory is a non-volatile memory.

68. A semiconductor memory according to claim 66, wherein said first prior pulse and said second prior pulse have almost a same amplitude.

69. A semiconductor memory according to claim 66, wherein said first following pulse and said second following pulse have almost a same amplitude.

70. A semiconductor memory according to claim 66, further comprising:

an input terminal which receives write information data to be stored in said memory cells; and a write data circuit coupled to said input terminal, wherein said write data circuit generates a signal which controls threshold levels of said memory cells.

71. A semiconductor memory according to claim 70, further comprising:

a sense latch circuit which stores said signal which controls said threshold level of said memory cells.

72. A semiconductor memory according to claim 71, wherein said sense latch circuit also stores a read out signal from said memory cells.

73. A semiconductor memory according to claim 66, wherein said threshold level of each of said memory cells are placed in one of four areas including an erase area, a first storing area, a second storing area, and a third storing area to store at least four-value information in each of said memory cells, said first storing area being located between said erase area and said second storing area, and said second storing area being located between said first storing area and said third storing area.

74. A semiconductor memory according to claim 66, wherein said threshold voltages of memory cells located in said first storing area and said second storing area are moved to said erase area by executing an erase command.

75. A semiconductor memory according to claim 66, wherein each threshold voltage of each memory cell is set by electrically programming electrons to said floating gate.

76. A semiconductor memory according to claim 66, wherein said second write operation is operated after said threshold level of memory cell is established by said first write operation.

77. A semiconductor memory according to claim 66, wherein said first reference level and second reference level are different levels.

78. A non-volatile semiconductor memory comprising:

a plurality of memory cells, each memory cell having a floating gate, wherein a threshold level of each of said memory cells depends on a value of electric charge in said floating gate of each memory cell, wherein said threshold level of each memory cell is placed in one of three areas including an erase area, a first storing area, and a second storing area for storing three value data in said memory cell, said first storing area being located between said erase area and said second storing area; and a write circuit which performs a first write operation and a second write operation, after said first write operation, wherein said first write operation includes a first pulse which is applied to memory cells whose threshold level is to be changed to store said data, wherein said second write operation includes a second pulse which is applied to memory cells whose threshold level is to be changed by said first write operation, wherein said first write operation includes a first verify operation to detect a threshold level of each of said memory cells to verify whether a threshold level of said memory cell is located in first predetermined area, and wherein said second write operation includes a second verify operation to detect a threshold level of each of said memory cells to verify whether a threshold level of said memory cell is located in second predetermined area.

79. A semiconductor memory according to claim 78, wherein said second write operation is operated after said threshold level of memory cell is established in said first predetermined area by said first write operation.

80. A semiconductor memory according to claim 78, wherein said first verify operation and second verify operation use different reference signals.

81. A semiconductor memory comprising:

a plurality of memory cells, each memory cell having a floating gate, and a threshold level of each memory cell depends on a value of electric condition of said floating gate of each memory cell, wherein said threshold level of each memory cells placed in one of three areas including an erase area, a first storing area, and a second storing area for storing three value data in each of said memory cells;

a word line and a data line coupled to each of said memory cell; and a write circuit which performs a first write operation and a second write operation to store said three value data in each of said memory cells, wherein threshold level of at least one memory cell is moved to a first predetermined area and fixed in said first predetermined area by said first write operation, wherein threshold level of at least one memory cell whose threshold level is fixed in said first predetermined area by said first write operation, is moved to a second predetermined area and fixed in said second predetermined area by said second write operation, wherein said first write operation applies a first set of pulses to said word line, and wherein said second write operation applies a second set of pulses to said word line.

82. A non-volatile semiconductor memory according to claim 81, wherein said first write operation includes a first read out operation to detect a threshold level of said memory cells, and wherein said second write operation includes a second read out operation to detect a threshold level of said memory cells.

83. A non-volatile semiconductor memory according to claim 82, wherein said first read out operation and said second read out operation use different reference signals.

84. A non-volatile semiconductor memory according to claim 81, wherein said first set of pulses and said second set of pulses include almost a same wave form.

* * * * *